(12) United States Patent
Tan et al.

(10) Patent No.: US 11,205,597 B2
(45) Date of Patent: Dec. 21, 2021

(54) SEMICONDUCTOR DEVICE AND METHOD

(71) Applicant: Taiwan Semiconductor Manufacturing Company, Ltd., Hsinchu (TW)

(72) Inventors: Wei-Chun Tan, New Taipei (TW); I-Hsieh Wong, Hsinchu (TW); Te-En Cheng, Taoyuan (TW); Yung-Hui Lin, New Taipei (TW); Wei-Ken Lin, Tainan (TW); Wei-Yang Lee, Taipei (TW); Chih-Hung Nien, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/458,437

(22) Filed: Jul. 1, 2019

(65) Prior Publication Data

US 2020/0105620 A1   Apr. 2, 2020

Related U.S. Application Data

(60) Provisional application No. 62/738,881, filed on Sep. 28, 2018.

(51) Int. Cl.
*H01L 21/311* (2006.01)
*H01L 29/16* (2006.01)
(Continued)

(52) U.S. Cl.
CPC .. *H01L 21/823821* (2013.01); *H01L 21/0206* (2013.01); *H01L 21/02126* (2013.01);
(Continued)

(58) Field of Classification Search
CPC ............. H01L 29/7833; H01L 29/7851; H01L 29/6656; H01L 29/66795; H01L 29/7848;
(Continued)

(56) References Cited

U.S. PATENT DOCUMENTS 10,151,048 B1 * 12/2018 Wu .................. C30B 25/186
2005/0280098 A1 * 12/2005 Shin ................ H01L 29/66628
257/371

(Continued)

FOREIGN PATENT DOCUMENTS

KR    20160059861 A    5/2016
KR    20160063224 A    6/2016
(Continued)

*Primary Examiner* — Brian Turner
(74) *Attorney, Agent, or Firm* — Slater Matsil, LLP

(57) ABSTRACT

A method includes forming a first fin extending from a substrate, forming a first gate stack over and along sidewalls of the first fin, forming a first spacer along a sidewall of the first gate stack, the first spacer including a first composition of silicon oxycarbide, forming a second spacer along a sidewall of the first spacer, the second spacer including a second composition of silicon oxycarbide, forming a third spacer along a sidewall of the second spacer, the third spacer including silicon nitride, and forming a first epitaxial source/drain region in the first fin and adjacent the third spacer.

17 Claims, 35 Drawing Sheets

(51) Int. Cl.

| | | |
|---|---|---|
| *H01L 27/092* | (2006.01) | |
| *H01L 29/06* | (2006.01) | |
| *H01L 21/306* | (2006.01) | |
| *H01L 21/8238* | (2006.01) | |
| *H01L 21/02* | (2006.01) | |
| *H01L 21/265* | (2006.01) | |
| *H01L 21/308* | (2006.01) | |
| *H01L 21/3115* | (2006.01) | |
| *H01L 21/3065* | (2006.01) | |
| *H01L 29/66* | (2006.01) | |
| *H01L 29/08* | (2006.01) | |
| *H01L 21/027* | (2006.01) | |
| *H01L 21/762* | (2006.01) | |
| *H01L 21/266* | (2006.01) | |
| *H01L 29/36* | (2006.01) | |

(52) U.S. Cl.
CPC .. *H01L 21/02532* (2013.01); *H01L 21/26513* (2013.01); *H01L 21/308* (2013.01); *H01L 21/3065* (2013.01); *H01L 21/31116* (2013.01); *H01L 21/31155* (2013.01); *H01L 21/823807* (2013.01); *H01L 21/823814* (2013.01); *H01L 21/823828* (2013.01); *H01L 21/823864* (2013.01); *H01L 29/0847* (2013.01); *H01L 29/66545* (2013.01); *H01L 21/0228* (2013.01); *H01L 21/0276* (2013.01); *H01L 21/266* (2013.01); *H01L 21/76224* (2013.01); *H01L 21/823878* (2013.01); *H01L 29/36* (2013.01)

(58) Field of Classification Search
CPC ......... H01L 21/30608; H01L 29/66803; H01L 29/785
See application file for complete search history.

(56) References Cited

U.S. PATENT DOCUMENTS

| | | | | |
|---|---|---|---|---|
| 2009/0246921 A1* | 10/2009 | Cheng | ............. | H01L 21/823807 438/221 |
| 2012/0223418 A1* | 9/2012 | Stowers | ............. | C23C 18/1216 257/632 |
| 2012/0257181 A1* | 10/2012 | Funabashi | ......... | H01L 21/67051 355/30 |
| 2013/0122676 A1* | 5/2013 | Jeng | ................ | H01L 21/823431 438/306 |
| 2014/0141589 A1* | 5/2014 | Shin | ................ | H01L 21/823807 438/306 |
| 2014/0369115 A1* | 12/2014 | Kim | ....................... | H01L 29/518 365/182 |
| 2015/0031177 A1* | 1/2015 | Riley | .............. | H01L 21/823807 438/199 |
| 2015/0044830 A1* | 2/2015 | Farber | ............. | H01L 21/823814 438/229 |
| 2015/0221654 A1* | 8/2015 | Kim | .................. | H01L 21/02579 257/77 |
| 2015/0333075 A1* | 11/2015 | Yang | ....................... | H01L 29/06 257/369 |
| 2016/0042952 A1* | 2/2016 | Tsai | .................. | H01L 29/66795 438/154 |
| 2016/0049496 A1* | 2/2016 | Lu | ..................... | H01L 21/02057 257/401 |
| 2016/0141381 A1* | 5/2016 | Kim | ..................... | H01L 29/785 257/288 |
| 2016/0149017 A1 | 5/2016 | Tsai et al. | | |
| 2016/0190017 A1* | 6/2016 | Lee | ..................... | H01L 21/0262 257/192 |
| 2016/0365426 A1* | 12/2016 | Ching | .............. | H01L 29/66795 |
| 2017/0005195 A1* | 1/2017 | Ching | .................. | H01L 29/165 |
| 2017/0077110 A1* | 3/2017 | Liu | .................... | H01L 29/40114 |
| 2017/0125299 A1* | 5/2017 | Pranatharthiharan | ...................... | H01L 29/517 |
| 2017/0179286 A1* | 6/2017 | Ye | ..................... | H01L 29/66636 |
| 2017/0271153 A1* | 9/2017 | Tsai | ................. | H01L 21/02658 |
| 2018/0151706 A1 | 5/2018 | Lin et al. | | |
| 2018/0254338 A1* | 9/2018 | Kim | .................. | H01L 29/66545 |

FOREIGN PATENT DOCUMENTS

| | | |
|---|---|---|
| KR | 20180060941 A | 6/2018 |
| TW | 201724519 A | 7/2017 |
| TW | 201820413 A | 6/2018 |
| TW | 201830497 A | 8/2018 |

* cited by examiner

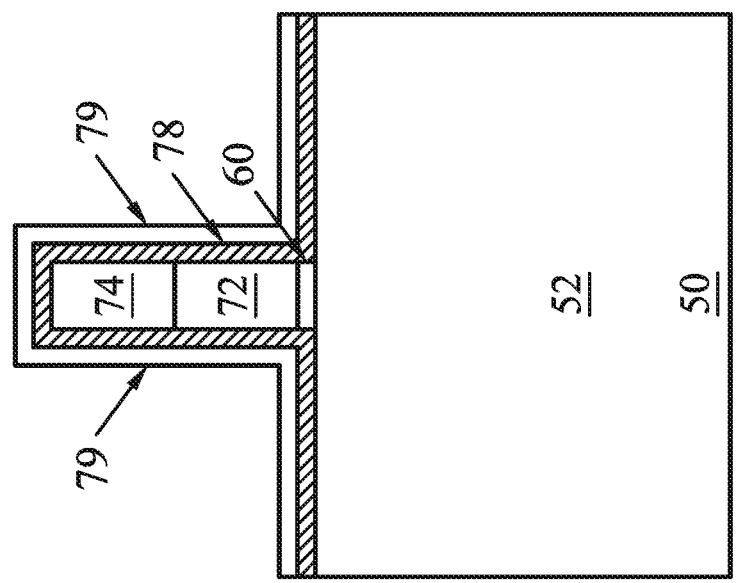
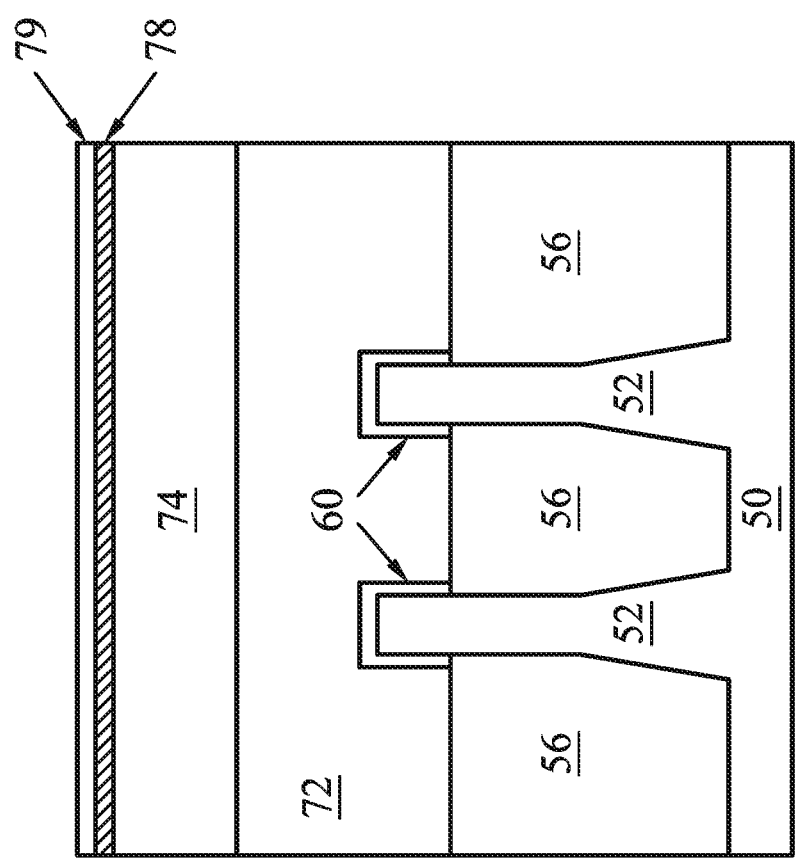
Figure 9B
Figure 9A

SEMICONDUCTOR DEVICE AND METHOD

PRIORITY CLAIM AND CROSS-REFERENCE

This patent application claims priority to U.S. Provisional Application No. 62/738,881, filed on Sep. 28, 2018 and entitled "Semiconductor Device and Method," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, and 9B are cross-sectional views of intermediate stages in the manufacturing of FinFETs, in accordance with some embodiments.

DETAILED DESCRIPTION

Figure 1:
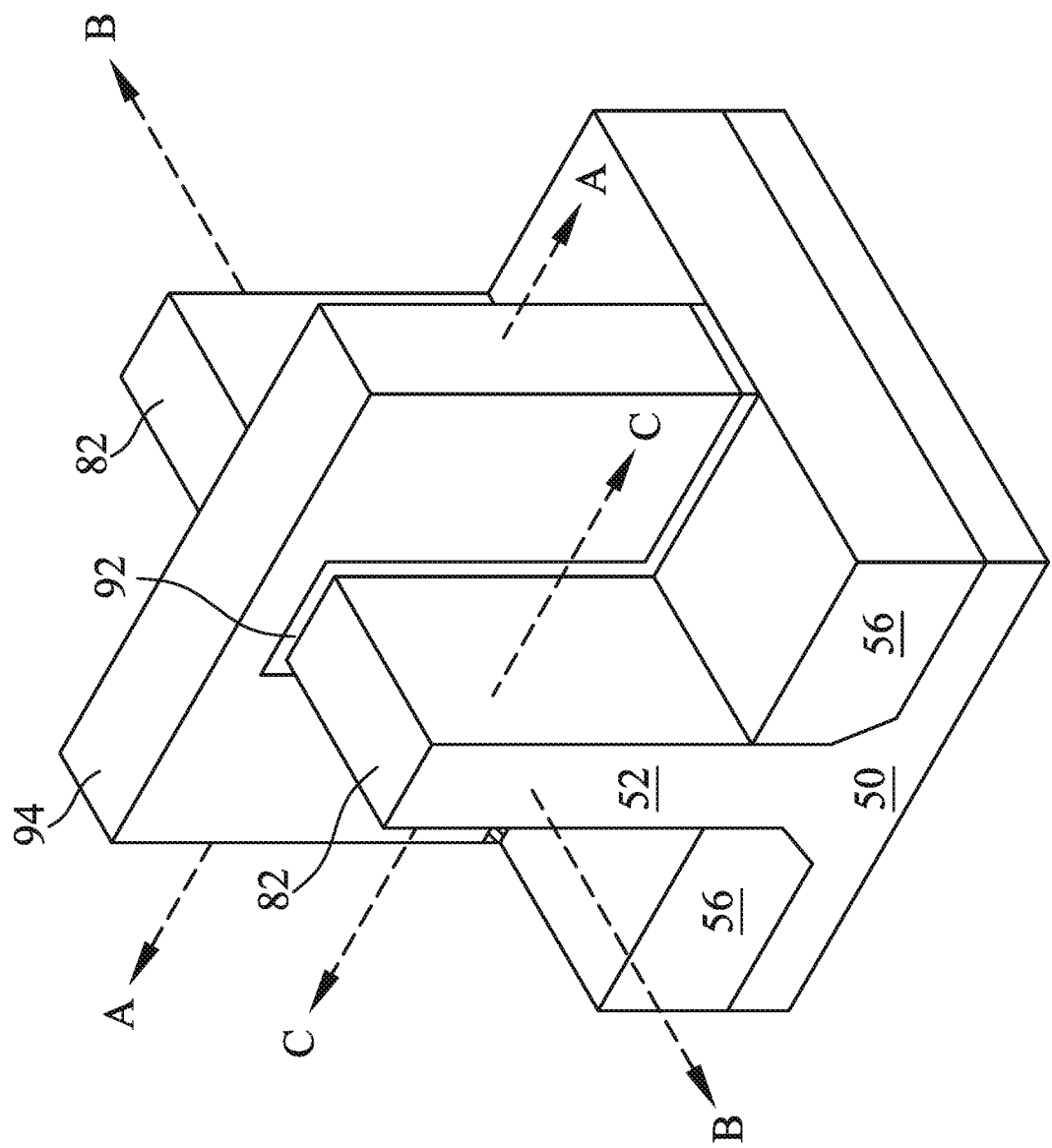
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming gate spacers and forming epitaxial source/drain regions in a FinFET device. In some embodiments, a low-k material such as silicon oxycarbide may be used for some or all of the gate spacers. The use of silicon oxycarbide for gate spacers can reduce parasitic capacitance within the FinFET device. Additionally, selectively masking device regions and separately etching recesses for epitaxial source/drain regions in each device region can form different epitaxial source/drain regions in each device region at the same time, using the same epitaxial formation process. The epitaxial source/drain regions for different types of devices can thus be simultaneously formed having characteristics for each type of device. By using a wet chemical process of heated sulfuric acid and hydrogen peroxide to clean and prepare surfaces prior to each multipatterning step, damage to silicon oxycarbide layers may be reduced. Thus, both the benefits of silicon oxycarbide and the benefits of multipatterning can be achieved in a process flow with reduced chance of processing defects.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94.

FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 9B and 11A through 26B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A through 9B, 11A-B, and 20A through 26B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. In FIGS. 12A through 19B, figures ending with an "A" designation are illustrated along reference cross-section C-C illustrated in FIG. 1, and figures ending with a "B" designation are illustrated along a similar cross-section B-B illustrated in FIG. 1, except for multiple fins/FinFETs. FIG. 24 is illustrated along reference cross-section B-B illustrated in FIG. 1, except for multiple fins/FinFETs.

Figure 2:
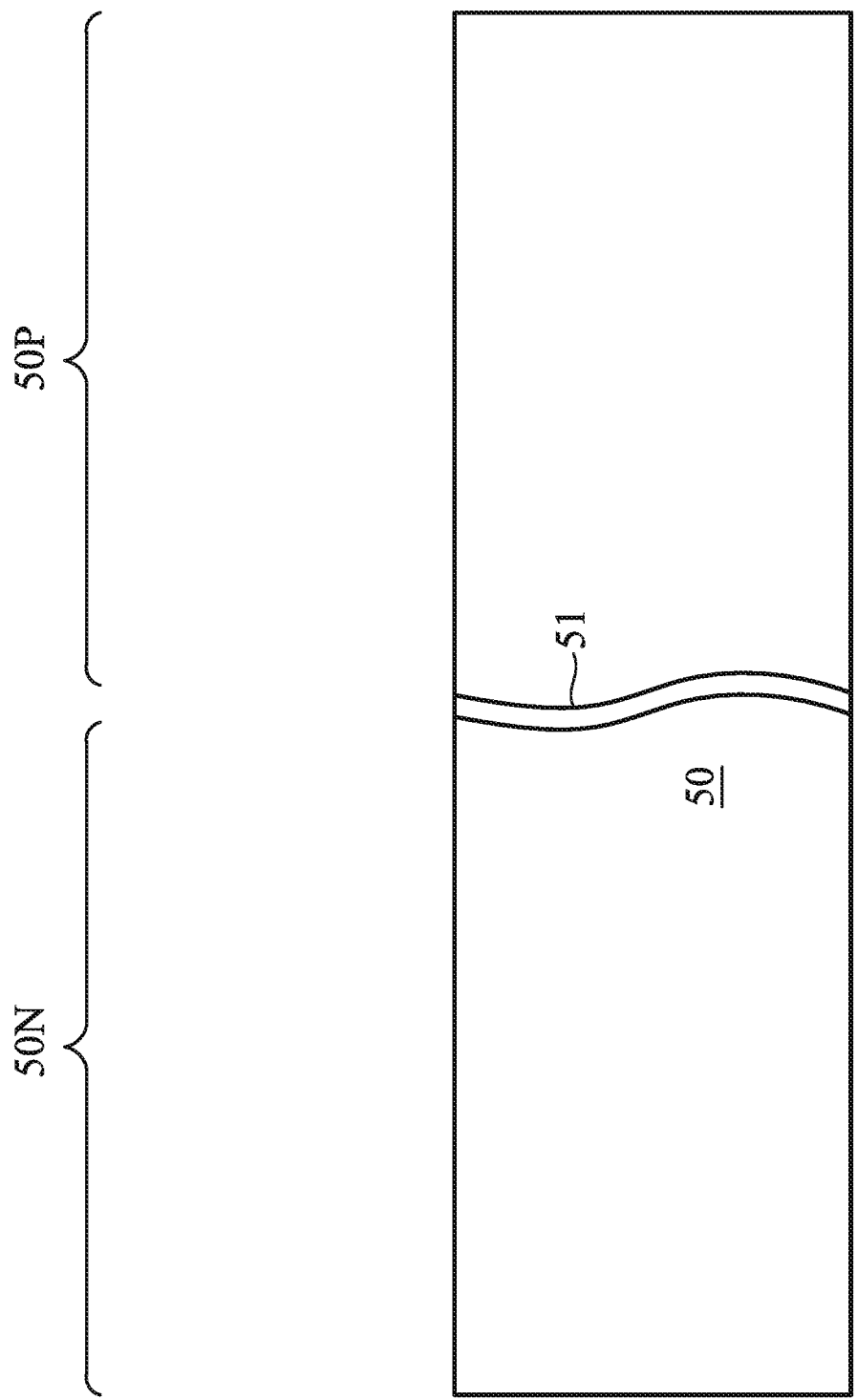

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P. In some embodiments, both the region 50N and the region 50P are used to form the same type of devices, such as both regions being for n-type devices or p-type devices.

In some embodiments, more than one kind of n-type device may be formed in region 50N or more than one kind of p-type device may be formed in region 50P. For example, in some embodiments, region 50P may include subregions 50P-1 in which first p-type devices (e.g., p-type FinFETs of a first design) are formed and subregions 50P-2 in which second p-type devices (e.g., p-type FinFETs of a second design) are formed. (See, for example, the embodiments described below with respect to FIGS. 12A-19B.) In some embodiments, different devices in different subregions may be formed using a multipatterning process (e.g., a "2P2E" process or other type of multipatterning process). The region 50N may similarly include subregions in which different n-type devices are formed. In some embodiments, the region 50N or the region 50P may contain only one region or may contain two or more subregions. Subregions may be physically separated from other subregions, and any number of device features may be disposed between subregions.

Figure 3:
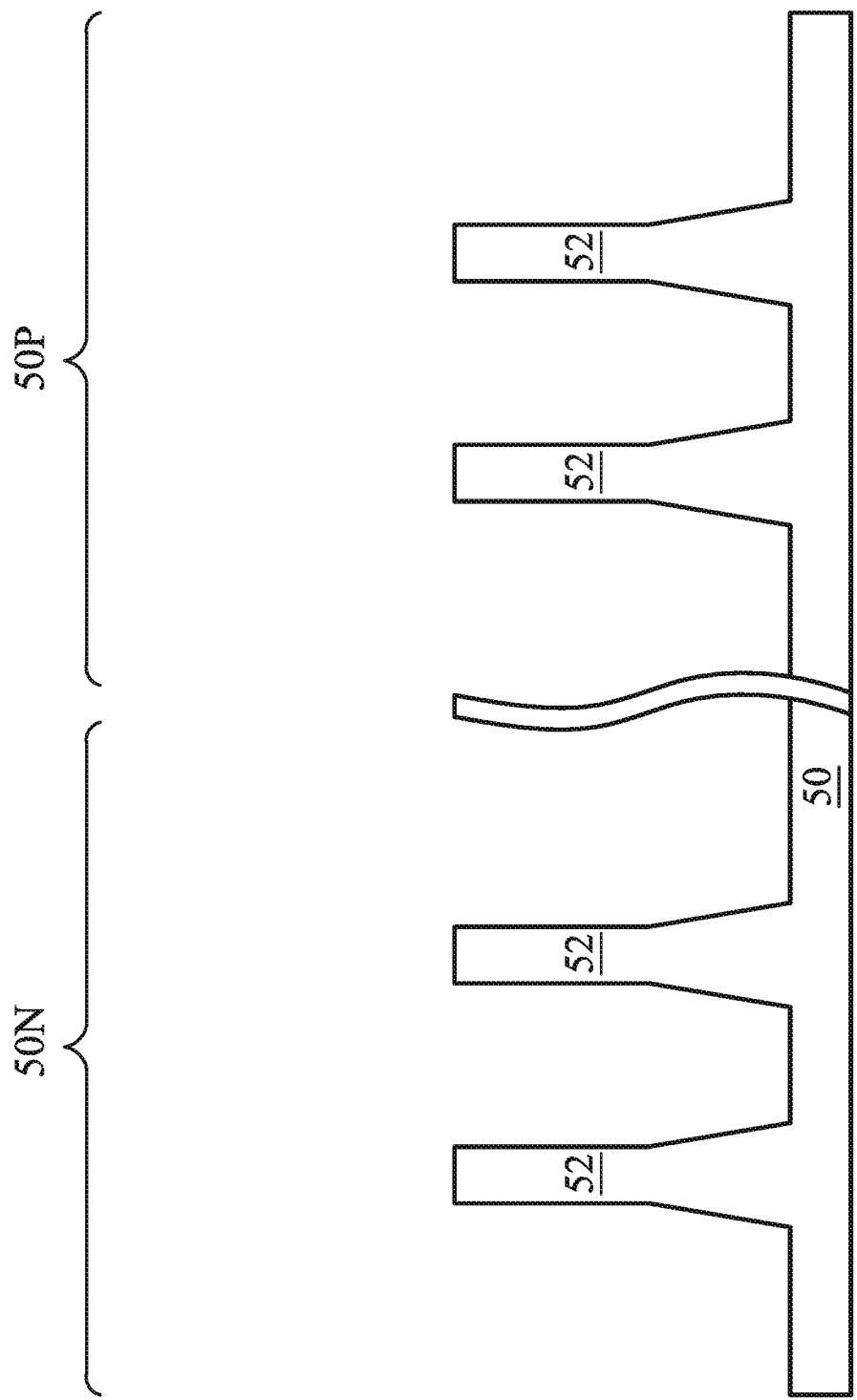

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
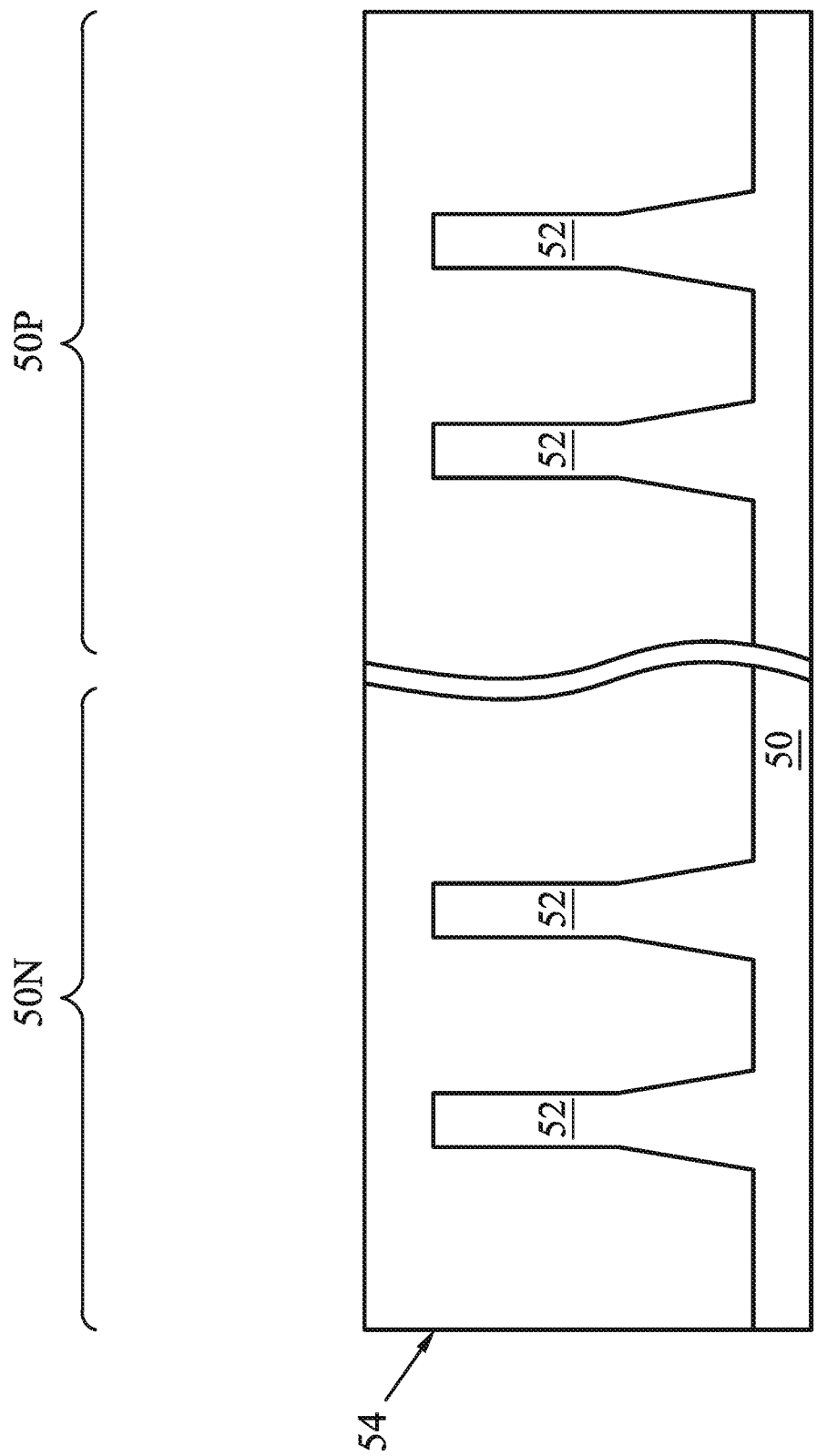

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along a surface of the substrate 50 and the fins 52. Thereafter, a fill material such as those discussed above may be formed over the liner.

Figure 5:
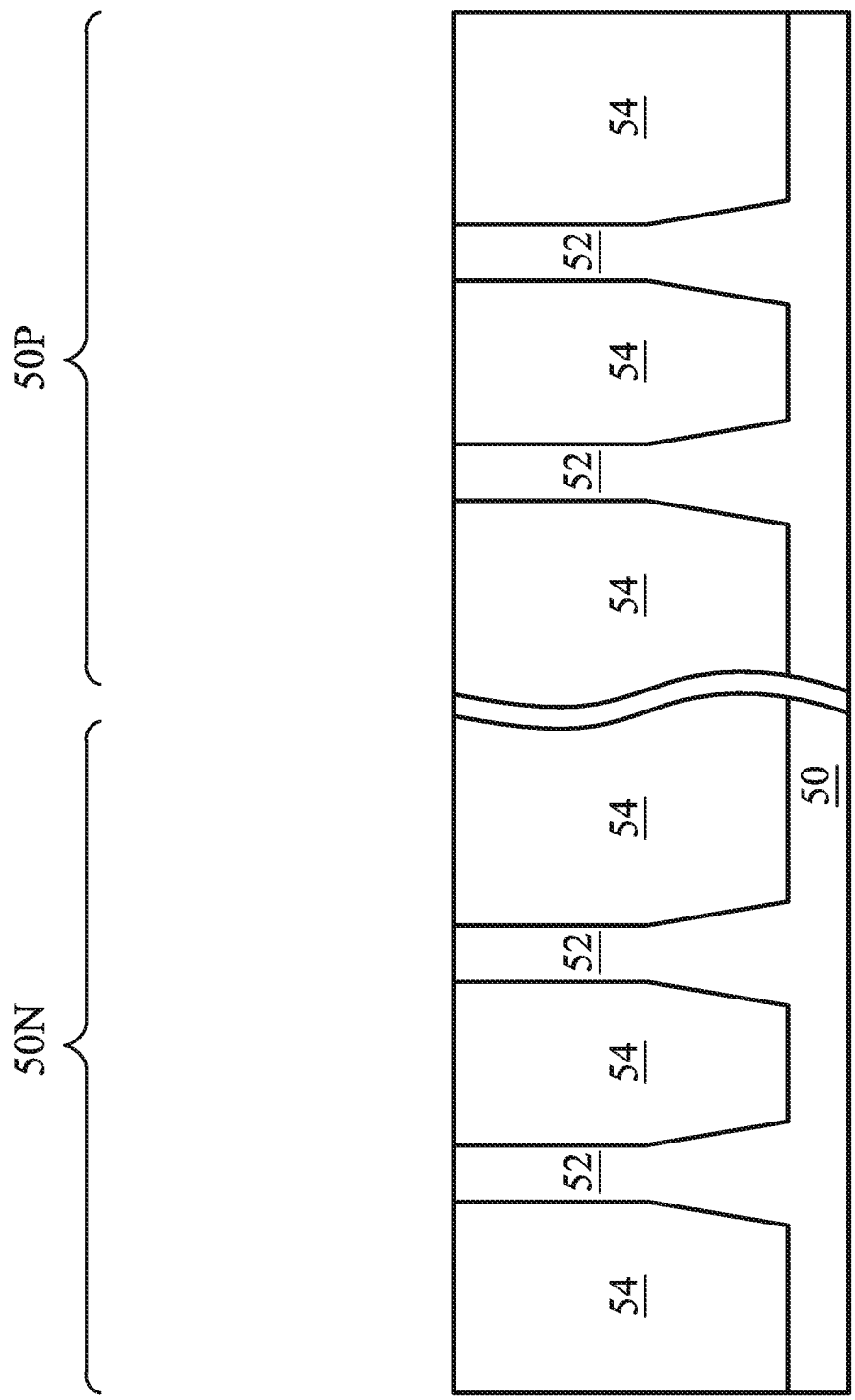

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
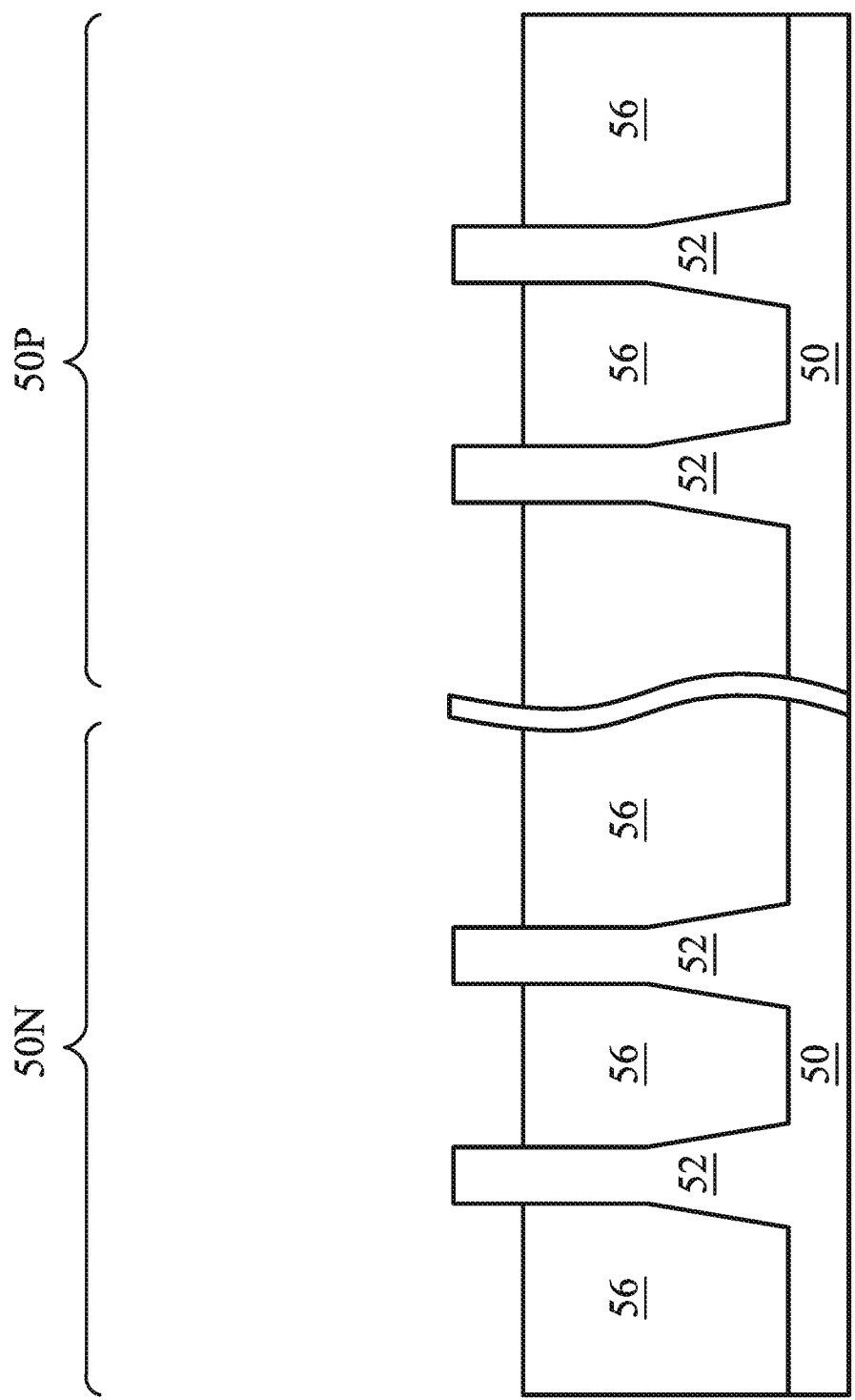

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown. The epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
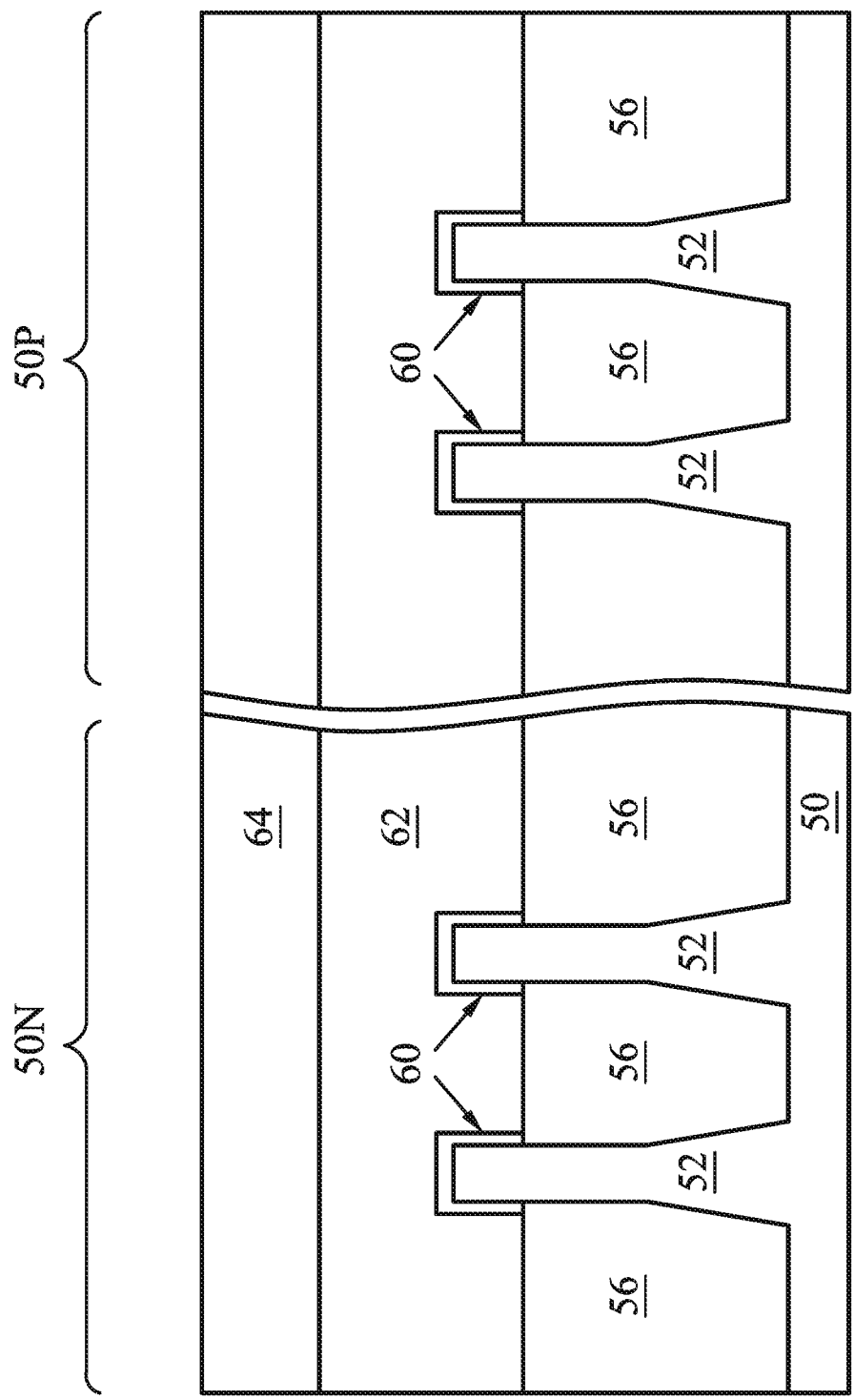

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 9B and 11A through 11B illustrate various additional steps in the manufacturing of embodiment devices. FIGS. 8A-9B and 11A-B illustrate features in either of the region 50N and the region 50P. For example, the structures illustrated may be applicable to both the region 50N and the region 50P. Differences (if any) in the structures of the region 50N and the region 50P are described in the text accompanying each figure.

Figure 8B:
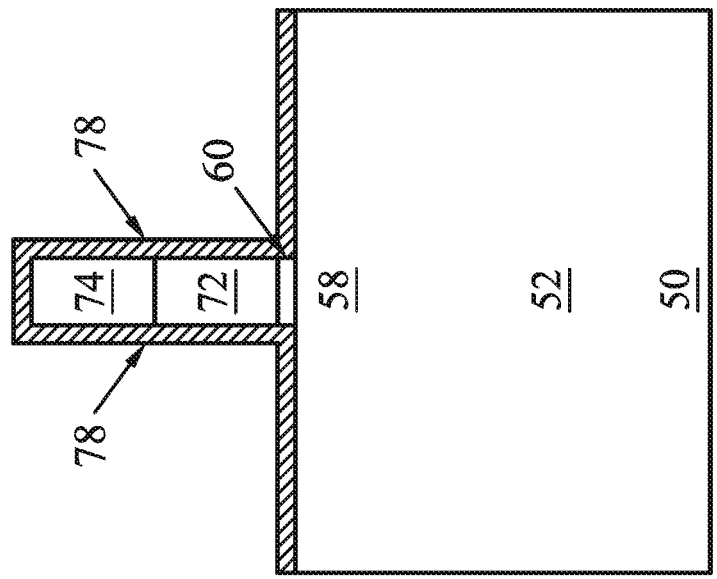
Figure 8A:
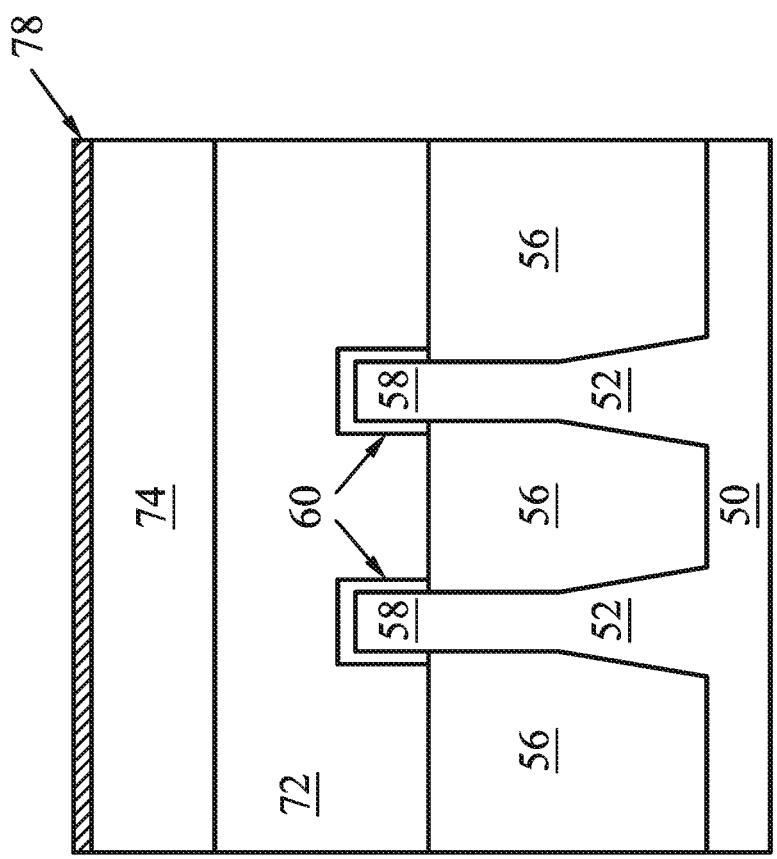

In FIGS. 8A and 8B, the mask layer 64 may be patterned using acceptable photolithography and etching techniques to form masks 74. The pattern of the masks 74 then may be transferred to the dummy gate layer 62. In some embodiments, the pattern of the masks 74 may also be transferred to the dummy dielectric layer 60 by an acceptable etching technique, forming dummy gates 72 over remaining portions of the dummy dielectric layer 60. In some embodiments (not separately illustrated), the dummy dielectric layer 60 may not be patterned. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, first spacer material 78 is formed on exposed surfaces of the dummy gates 72, the masks 74, and/or the fins 52. The first spacer material 78 is used to form first spacers 80 (see FIGS. 11A-B). In some embodiments, the first spacer material 78 may be a material such an oxide, a nitride, a material such as silicon oxynitride, silicon oxycarbonitride, silicon oxycarbide, the like, or a combination thereof. In some embodiments, the first spacer material 78 may be formed using a process such as thermal oxidation, CVD, PE-CVD, ALD, PVD, sputtering, or the like. In FIG. 8B, the first spacer material 78 is shown as extending vertically over the dummy gate 72 and mask 74 and laterally over the fin 52. In some embodiments, the first spacer material 78 may include multiple layers of one or more materials. In some embodiments, the first spacer material 78 may be formed having a thickness between about 3 nm and about 5 nm.

In some cases, the parasitic capacitance of a device (e.g., a FinFET device) may be reduced by using materials having a smaller dielectric constant (k). For example, the use of a first spacer material 78 having a smaller dielectric constant to form the first spacers 80 may reduce parasitic capacitance within the FinFET device, for example, between the gate electrodes 94 and the source/drain contacts 112 (see FIGS. 26A-B). In some embodiments, the first spacer material 78 may include a material having a dielectric constant of less than about k=3.9, such as about k=3.5 or less. For example, in some embodiments, a silicon oxycarbide material may be used for the first spacer material 78. Silicon oxycarbide has a dielectric constant of about k=3.5 or less, and thus the use of silicon oxycarbide for the first spacer material 78 can reduce parasitic capacitance within a FinFET device. In some embodiments, the silicon oxycarbide material may be deposited using a technique such as ALD or the like. In some embodiments, the silicon oxycarbide material may be deposited using a process temperature between about 50° C. and about 80° C. and a process pressure between about 5 torr and about 10 torr. In some embodiments, the silicon oxycarbide may be formed having between about 40 atomic % and about 46 atomic % of silicon, having between about 45 atomic % and about 50 atomic % of oxygen, or having between about 5 atomic % and about 18 atomic % of carbon. In some embodiments, different regions or different layers of the first spacer material 78 may contain different compositions of silicon oxycarbide.

After the formation of the first spacer material 78, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the fins 52 in the region 50P through the first spacer material 78. The mask may then be removed. Subsequently, a mask, such as a photoresist, may be formed over the region 50P while exposing the region 50N, and appropriate type impurities may be implanted into the fins 52 in the region 50N through the first spacer material 78. The mask may then be removed. The n-type impurities may be any of the n-type impurities previously discussed above in FIG. 6 or other n-type impurities, and the p-type impurities may be any of the p-type impurities previously discussed above in FIG. 6 or other p-type impurities. The lightly doped source/drain regions may have a concentration of impurities of that is between about $10^{15}$ cm$^{-3}$ and about $10^{16}$ cm$^{-3}$. An anneal may be used to activate the implanted impurities. Because the LDD dopant implantation is performed through the first spacer material 78, portions of the first spacer material 78 (and thus portions of the first spacers 80) may also be doped with the implanted impurities. As such, in some embodiments the first spacer material 78 may have a higher concentration of impurities than the second spacer material 79 (see FIGS. 9A-B), which is formed after the impurities are implanted.

In FIGS. 9A and 9B, second spacer material 79 is formed on the first spacer material 78. The second spacer material 79 is used to form second spacers 81 (see FIGS. 11A-B). In some embodiments, the second spacer material 79 may be a material such an oxide, a nitride, a material such as silicon oxynitride, silicon oxycarbonitride, silicon oxycarbide, the like, or a combination thereof. In some embodiments, the second spacer material 79 may be formed using a process such as CVD, PE-CVD, ALD, PVD, sputtering, or the like. In some embodiments, the second spacer material 79 may include multiple layers of one or more materials. In some embodiments, the second spacer material 79 may be formed having a thickness between about 3 nm and about 5 nm. Because the second spacer material 79 is formed after the implantation of impurities, the second spacer material 79 may have a lower concentration of the impurities than the first spacer material 78. In some embodiments, the second spacer material 79 and the second spacers 81 are omitted (not separately illustrated).

Similar to the first spacer material 78 described above (see FIG. 8B), by forming the second spacers 81 (see FIG. 11B) from a second spacer material 79 having a lower dielectric constant, parasitic capacitance within a device (e.g., a FinFET device) may be reduced. In some embodiments, the second spacer material 79 may include silicon oxycarbide, and thus may have a dielectric constant of less than about k=3.9, such as about k=3.5 or less. The silicon oxycarbide material of the second spacer material 79 may be formed in a manner similar to that described previously for forming silicon oxycarbide of the first spacer material 78, but the second spacer material 79 may be formed differently in other embodiments. The composition of the silicon oxycarbide of the second spacer material 79 may be similar to that described previously for the silicon oxycarbide of the first spacer material 78.

In some embodiments, both the first spacer material 78 of the first spacers 80 and the second spacer material 79 of the second spacers 81 may be formed from silicon oxycarbide. The first spacer material 78 and the second spacer material 79 may have about the same composition of silicon oxycarbide or have different compositions. For example the first spacer material 78 may have a composition of between about 45 atomic % and about 48 atomic % of oxygen and/or between about 12 atomic % and about 15 atomic % of carbon. The second spacer material 79 may have a composition of between about 47 atomic % and about 50 atomic % of oxygen and/or between about 10 atomic % and about 13 atomic % of carbon. The first spacer material 78 or the second spacer material 79 may have other compositions than these examples. In some cases, forming both the first spacer material 78 of the first spacers 80 and the second spacer material 79 of the second spacers 81 from silicon oxycarbide may reduce the parasitic capacitance more than forming one or both of the first spacers 80 or the second spacers 81 from a different material, such as a material with a higher dielectric constant.

Figure 10:
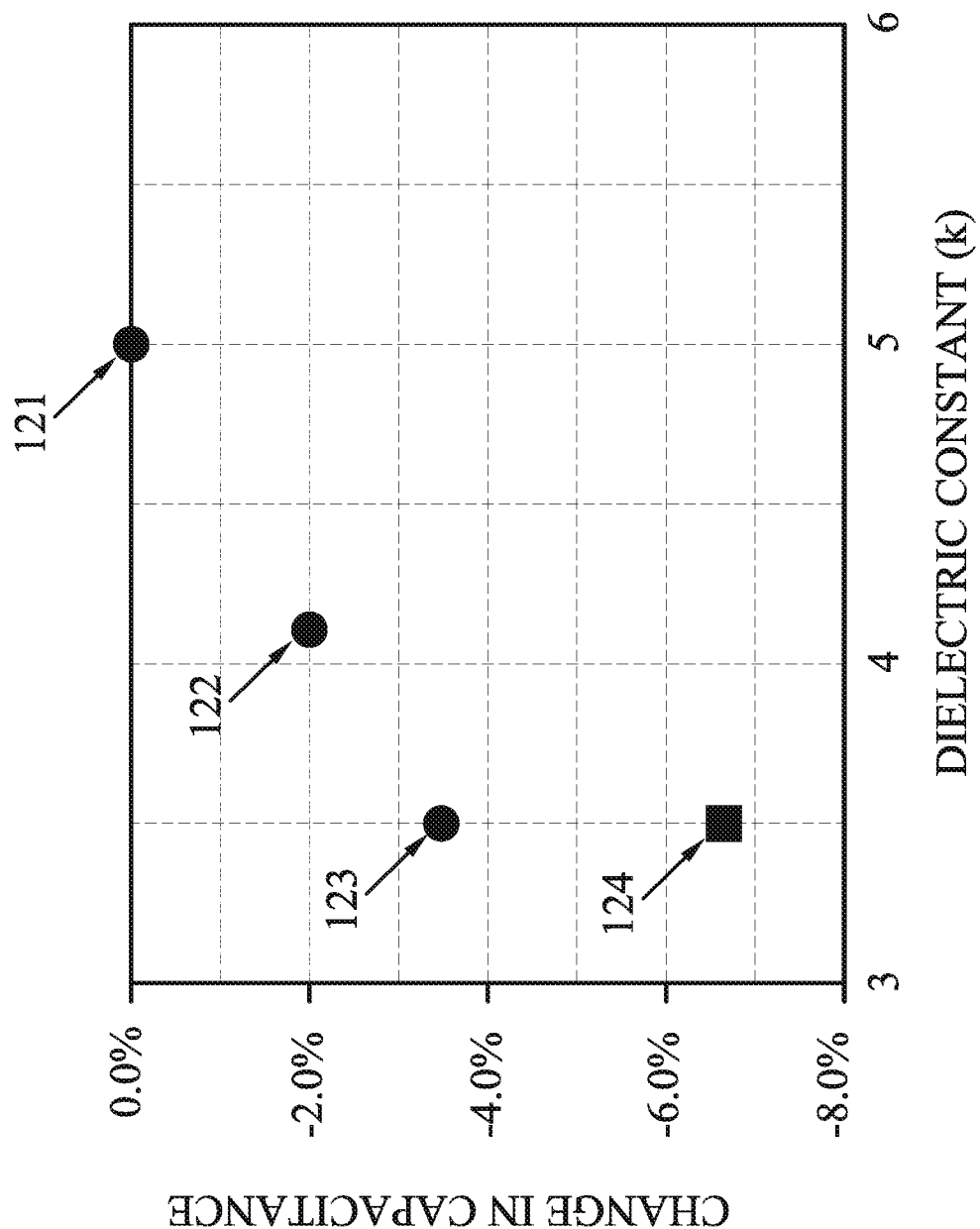
FIG. 10 is a graph showing simulation data of the change in parasitic capacitance of a FinFET device versus the dielectric constant of spacers of a FinFET device, in accordance with some embodiments.

Turning to FIG. 10, a graph shows simulation data of the percent change in parasitic capacitance of a FinFET device (on the Y-axis) versus the dielectric constant (k) of the second spacers 81 (on the X-axis). The change in parasitic capacitance is relative to point 121, which represents both the first spacer material 78 of the first spacers 80 and the second spacer material 79 of the second spacers 81 having a dielectric constant of about k=5. Point 122 indicates the change in capacitance due to the first spacer material 78 having a dielectric constant of about k=5 and the second spacer material 79 having a dielectric constant of about k=4. As shown, the smaller dielectric constant of the second spacer material 79 reduces the parasitic capacitance by about 2%.

Still referring to FIG. 10, point 123 indicates the change in capacitance due to the first spacer material 78 of the first spacers 80 having a dielectric constant of about k=5 and the second spacer material 79 of the second spacers 81 being formed from silicon oxycarbide having a dielectric constant of about k=3.5. As shown, the smaller dielectric constant of silicon oxycarbide reduces the parasitic capacitance by about 3.5%. Point 124 indicates the change in capacitance due to both the first spacer material 78 and the second spacer material 79 being formed from silicon oxycarbide having a dielectric constant of about k=3.5. As shown, by forming both the first spacer material 78 and the second spacer material 79 from silicon oxycarbide, the parasitic capacitance can be reduced by about 6.5%. Thus, as shown in the graph of FIG. 10, forming both the first spacer material 78 of the first spacers 80 and the second spacer material 79 of the second spacers 81 from silicon oxycarbide can reduce parasitic capacitance of a device such as a FinFET device. The graph and simulation data shown in FIG. 10 is for illustrative purposes, and the dielectric constants of the first spacer material 78 or the second spacer material 79 may be different in other cases, or the change in capacitance for various materials of the first spacer material 78 or the second spacer material 79 may be different in other cases.

Figure 11B:
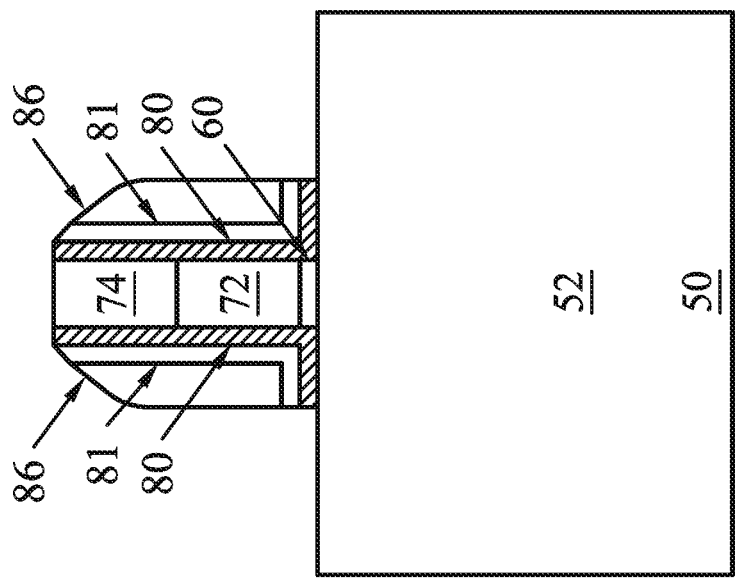
FIGS. 11A and 11B are cross-sectional views of intermediate stages in the manufacturing of FinFETs, in accordance with some embodiments.
Figure 11A:
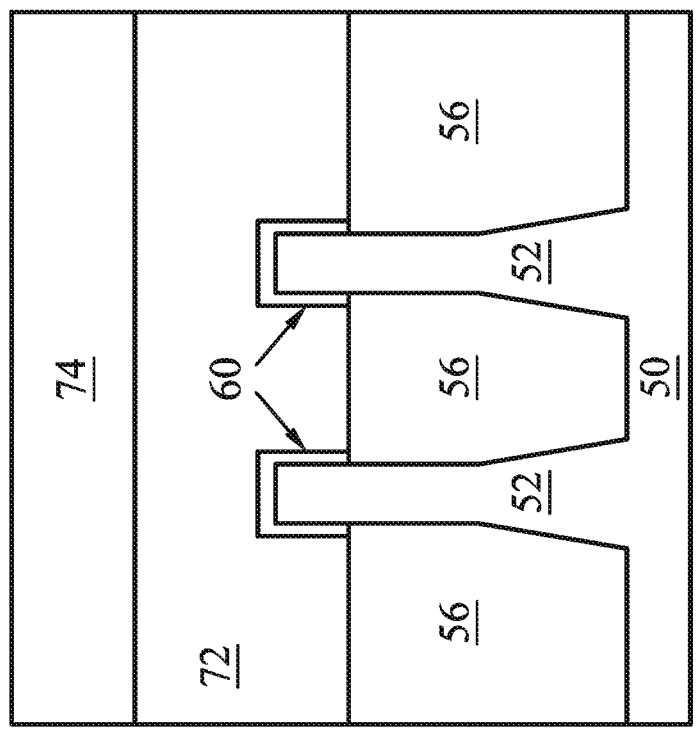

Turning to FIGS. 11A and 11B, first spacers 80, second spacers 81, and sidewall spacers 86 are formed. The sidewall spacers 86 may be formed, for example, by conformally depositing an insulating material over the second spacer material 79 and subsequently anisotropically etching the insulating material. In some embodiments, the anisotropic etching of the insulating material also etches the first spacer material 78 to form the first spacers 80 and etches the second spacer material 79 to form the second spacers 81. The second spacers 81 may have a lower concentration of implanted impurities than the first spacers 80, as described above with respect to second spacer material 79 and first spacer material 78. In some embodiments, the insulating material of the sidewall spacers 86 may be a low-k dielectric material, such as phosphosilicate glass (PSG), borophosphosilicate glass (BPSG), fluorinated silicate glass (FSG), silicon nitride, silicon oxycarbide, silicon carbide, silicon carbonitride, the like, or combinations thereof. The material of the sidewall spacers 86 may be formed by any suitable method, such as CVD, PE-CVD, ALD, or the like. In some embodiments, the sidewall spacers 86 may have a thickness between about 3 nm and about 5 nm.

Turning to FIGS. 12A through 19B, epitaxial source/drain regions 82A-B are formed in the fins 52, in accordance with some embodiments. FIGS. 12A-19B show the formation of epitaxial source/drain regions 82A in a subregion 50P-1 and formation of epitaxial source/drain regions 82B in a subregion 50P-2. Subregion 50P-1 and subregion 50P-2 may be subregions of the region 50P of the substrate 50. Epitaxial source/drain regions in the region 50N and in the region 50P (including epitaxial source/drain regions 82A-B) may collectively be referred to as epitaxial source/drain regions 82 herein. FIGS. 12A, 13A, 14A, 15A, 16A, 17A, 18A, and 19A are illustrated along reference cross-section C-C illustrated in FIG. 1, and FIGS. 12B, 13B, 14B, 15B, 16B, 17B, 18B, and 19B are illustrated along reference cross-section B-B illustrated in FIG. 1. The epitaxial source/drain regions 82 are formed in the fins 52 such that each dummy gate 72 is disposed between respective neighboring pairs of the epitaxial source/drain regions 82. In some embodiments that epitaxial source/drain regions 82 may extend into the fins 52. In some embodiments, the sidewall spacers 86 are used to separate the epitaxial source/drain regions 82 from the dummy gates 72 by an appropriate lateral distance so that the epitaxial source/drain regions 82 do not short out subsequently formed gates of the resulting FinFETs.

Figure 12A:
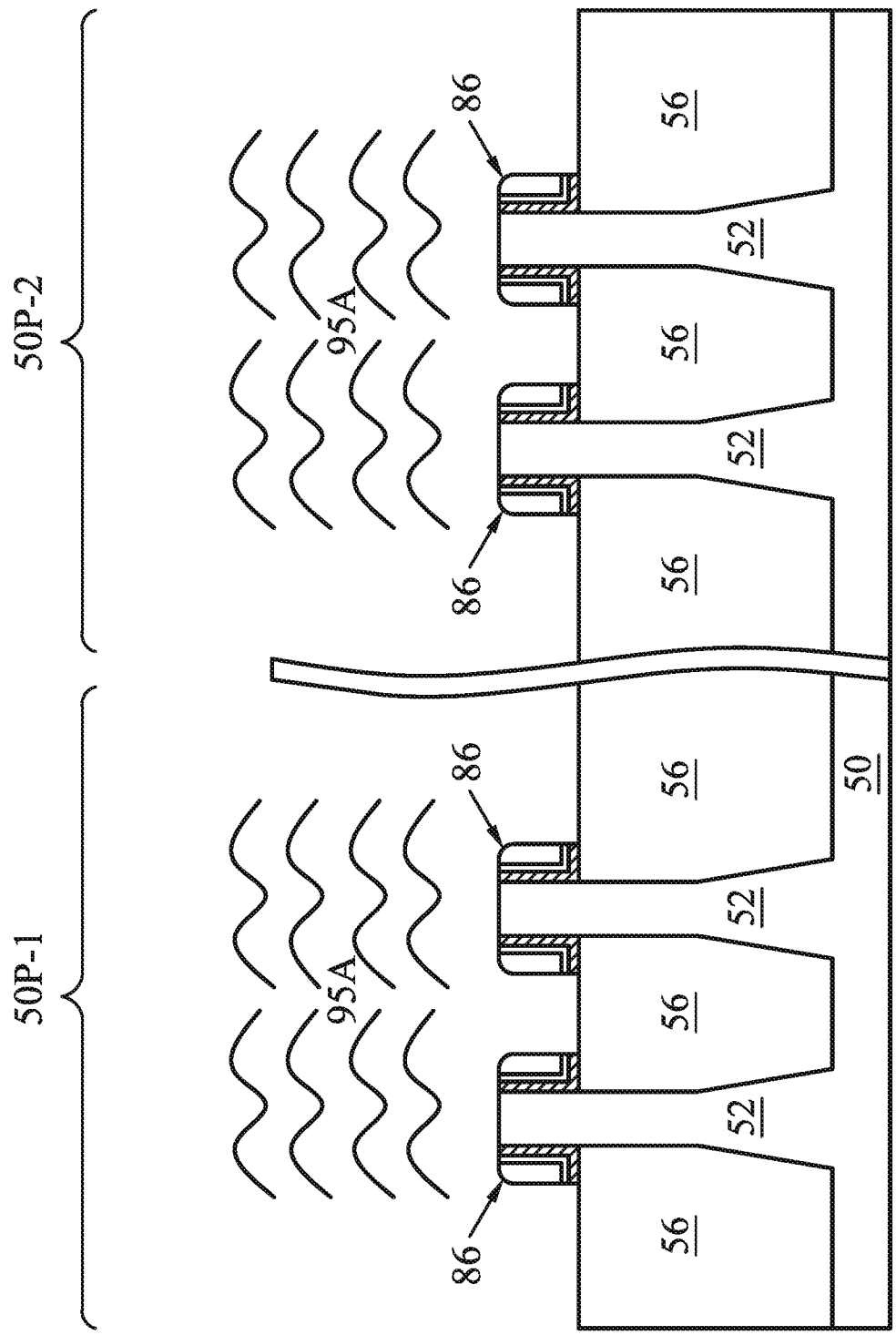
FIGS. 12A and 12B are cross-sectional views of a first wet cleaning process in an intermediate stage in the manufacturing of FinFETs, in accordance with some embodiments.
Figure 12B:
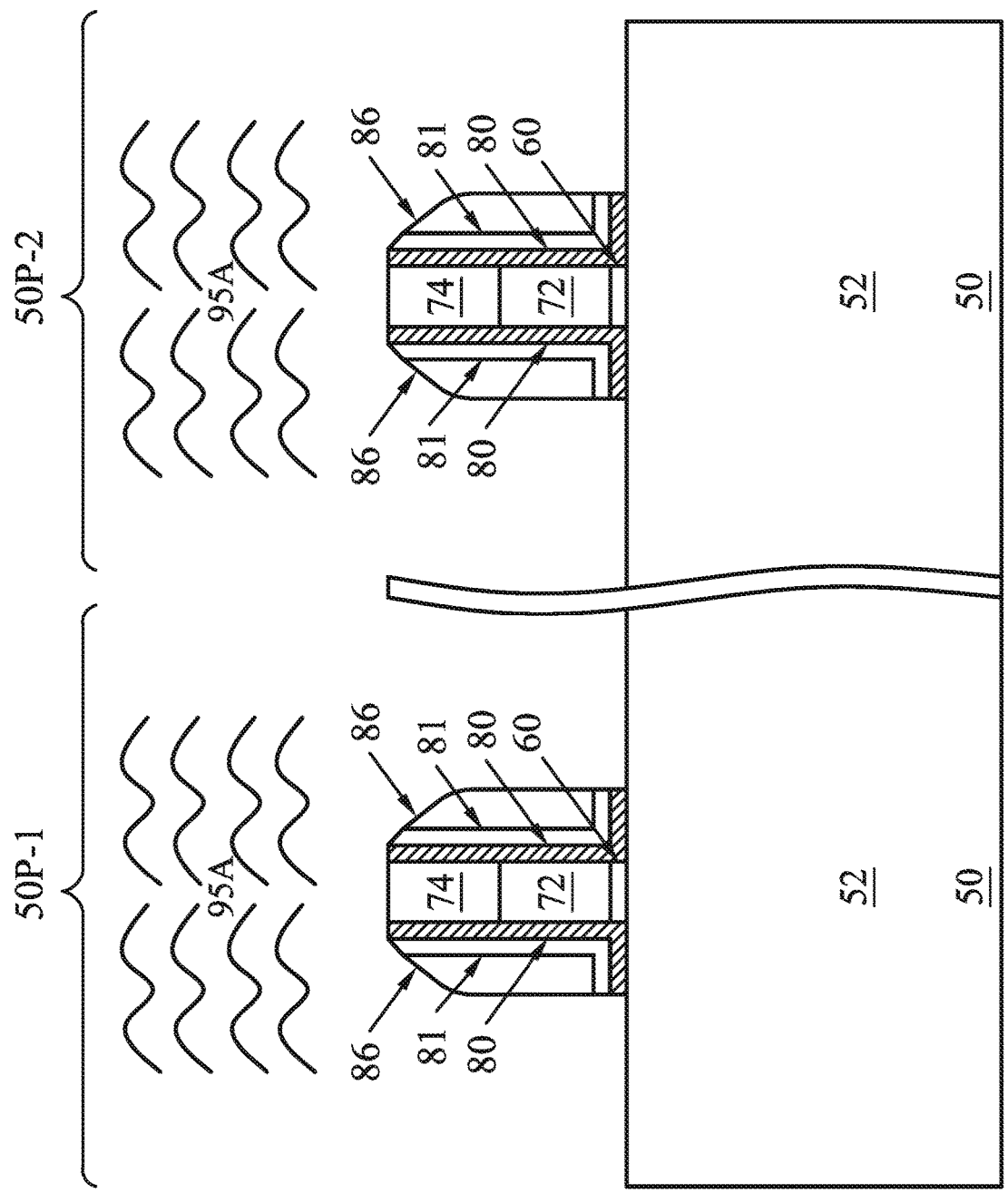

Turning to FIGS. 12A-B, a first wet cleaning process 95A is performed. The first wet cleaning process 95A may be a wet chemical cleaning process that removes residue from surfaces (e.g., a "descum" process). The first wet cleaning process 95A may also include a surface treatment that causes oxygen atoms to bond to surfaces of the sidewall spacers 86, which reduces outgassing of species such as nitrogen or hydrogen during subsequent process steps. In some cases, outgassing (e.g., NHx outgassing) can cause defects to occur during photoresist developing (sometimes referred to as "photoresist poison"). The first wet cleaning process 95A may be performed to prepare the structure for formation of mask 91A (see FIGS. 13A-B).

In some embodiments, the first wet cleaning process 95A may include a heated mixture of sulfuric acid ($H_2SO_4$) and hydrogen peroxide ($H_2O_2$). The mixture may be, for example, sulfuric acid and hydrogen peroxide mixed at a molar ratio between about 2:1 and about 5:1. The mixture may be heated to a temperature between about 80° C. and about 180° C. During the first wet cleaning process 95A, the structure may be submerged into the heated mixture, for example. This mixture described herein can remove residue and also reduce the chance of photolithography-related defects during photoresist patterning, such as defects due to "photoresist poison."

Additionally, a heated mixture of sulfuric acid and hydrogen peroxide used for the first wet cleaning process 95A may damage the first spacers 80 and second spacers 81 less than other cleaning techniques, such as plasma-based techniques (e.g., using hydrogen plasma, oxygen plasma, etc.). For example, some oxygen plasma cleaning techniques can deplete a silicon oxycarbide layer of carbon, causing damage to the layer and thus also causing possible processing problems or defects. The use of the mixture described herein can thus reduce photolithography-related defects (e.g., "photoresist poison") while also causing fewer damage-related defects when a silicon oxycarbide material is used. For example, by using the mixture described herein for the first wet cleaning process 95A, both the first spacers 80 and the second spacers 81 may be formed from silicon oxycarbide materials with reduced overall chance of processing problems or defects. In this manner, the benefits of using both a cleaning process (e.g., improved photolithography) and silicon oxycarbide materials (e.g., reduced parasitic capacitance) may be realized.

Figure 13A:
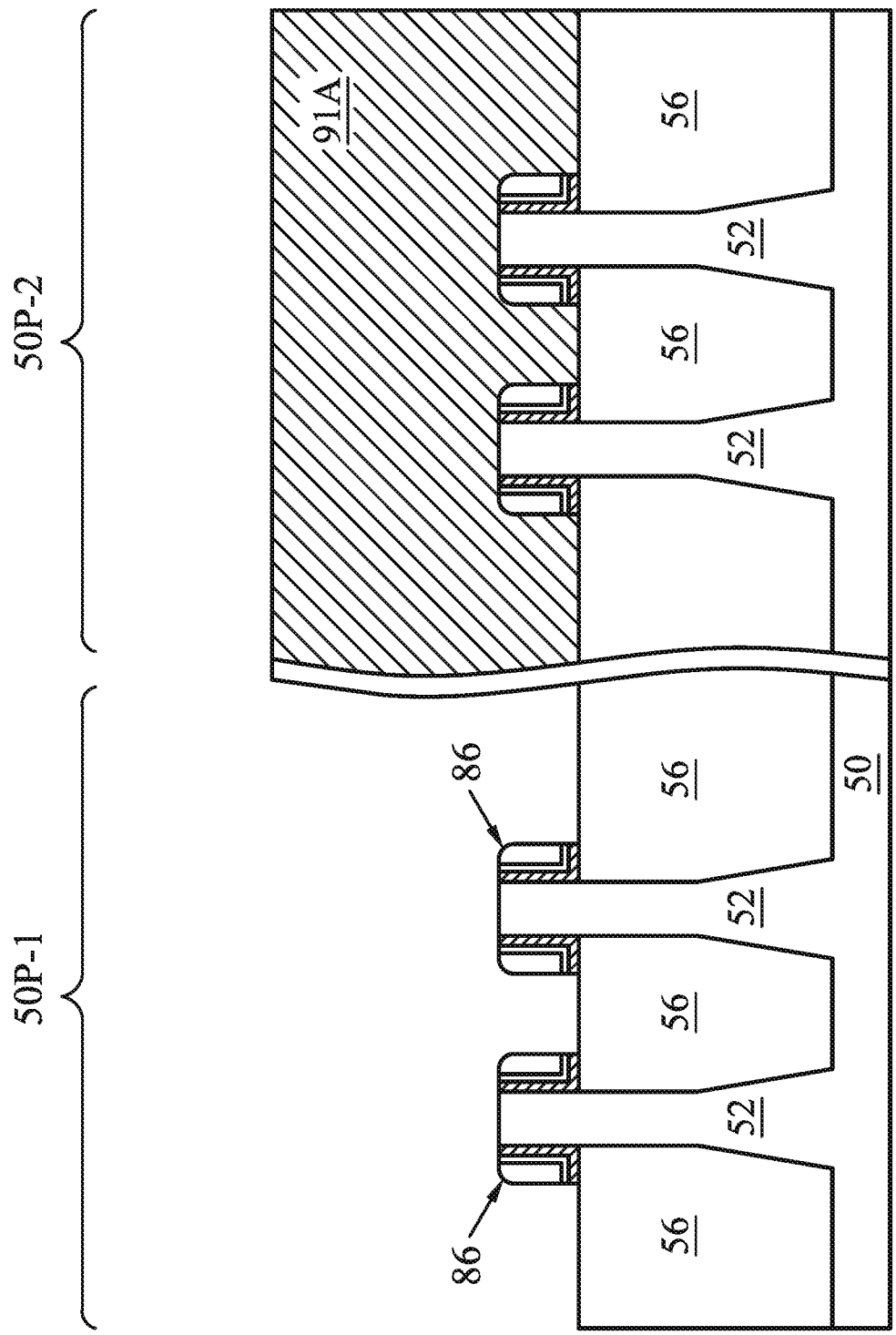
FIGS. 13A, 13B, 14A, and 14B are cross-sectional views of intermediate stages in the manufacturing of FinFETs, in accordance with some embodiments.
Figure 13B:
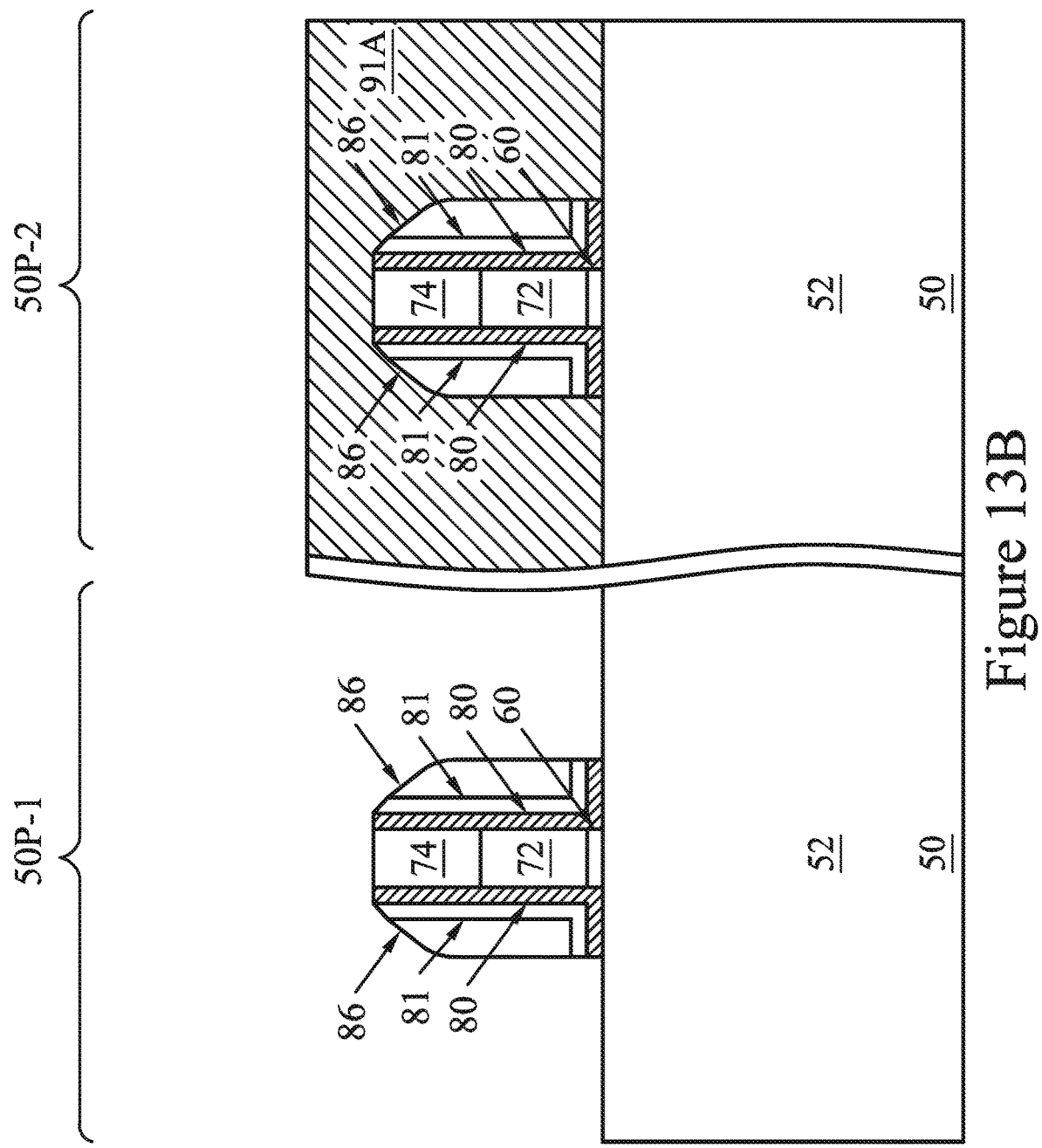

Turning to FIGS. 13A-B, a mask 91A is formed over the subregion 50P-2. The mask 91A may include a single layer or may be a multi-layer structure (e.g., a bi-layer structure, a tri-layer structure, or having more than three layers). The mask 91A may include materials such as photoresist materials, oxide materials, nitride materials, other dielectric materials, the like, or a combination thereof. In some embodiments, the mask 91A includes a bottom anti-reflective coating (BARC). The mask 91A may be formed using one or more suitable techniques, such as spin-on techniques, CVD, PE-CVD, ALD, PVD, sputtering, the like or a combination. The mask 91A may be patterned to expose portions of the subregion 50P-1 using suitable photolithographic and etching processes. For example, one or more wet etching processes or anisotropic dry etching processes may be used to etch the mask 91A.

Figure 14A:
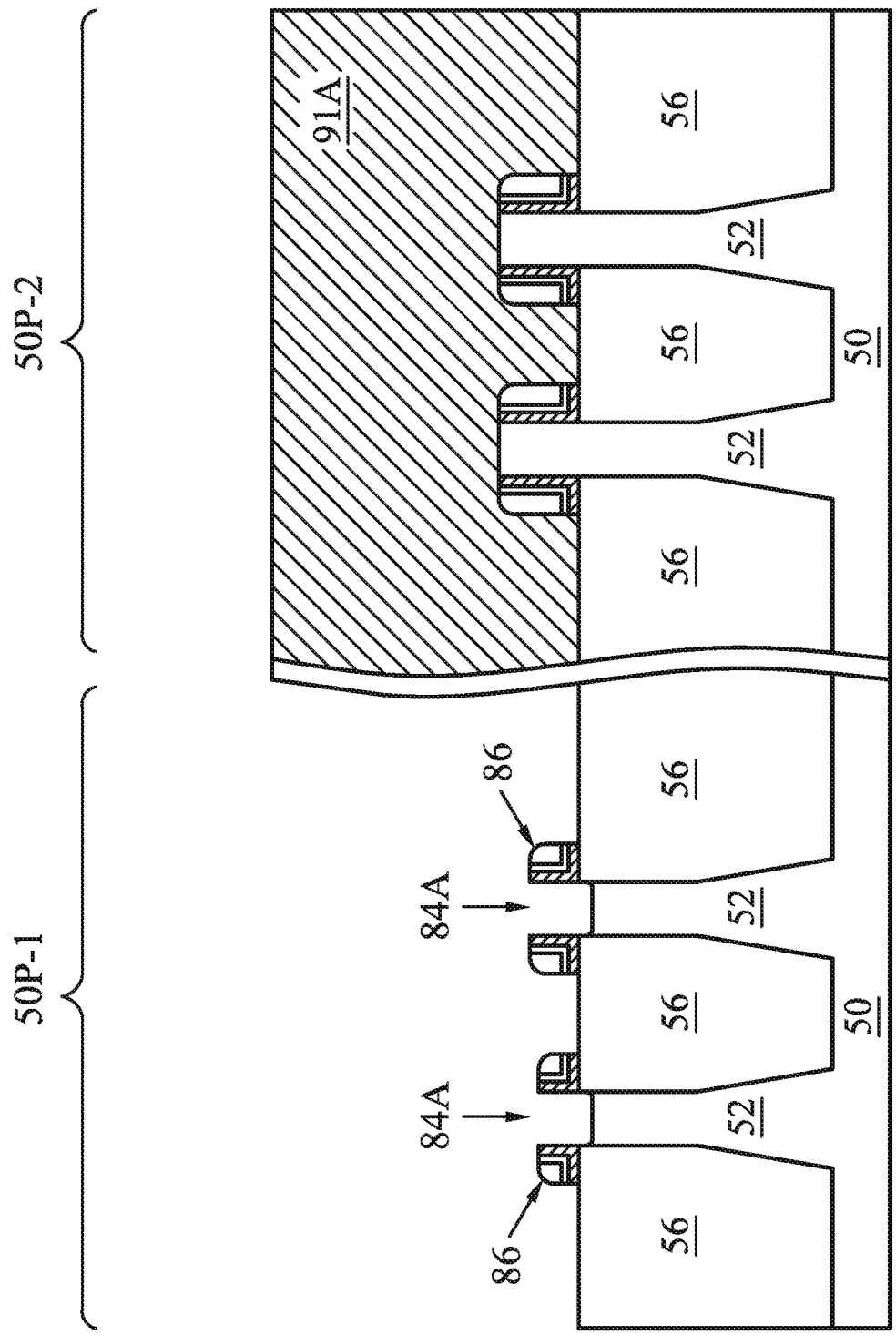
Figure 14B:
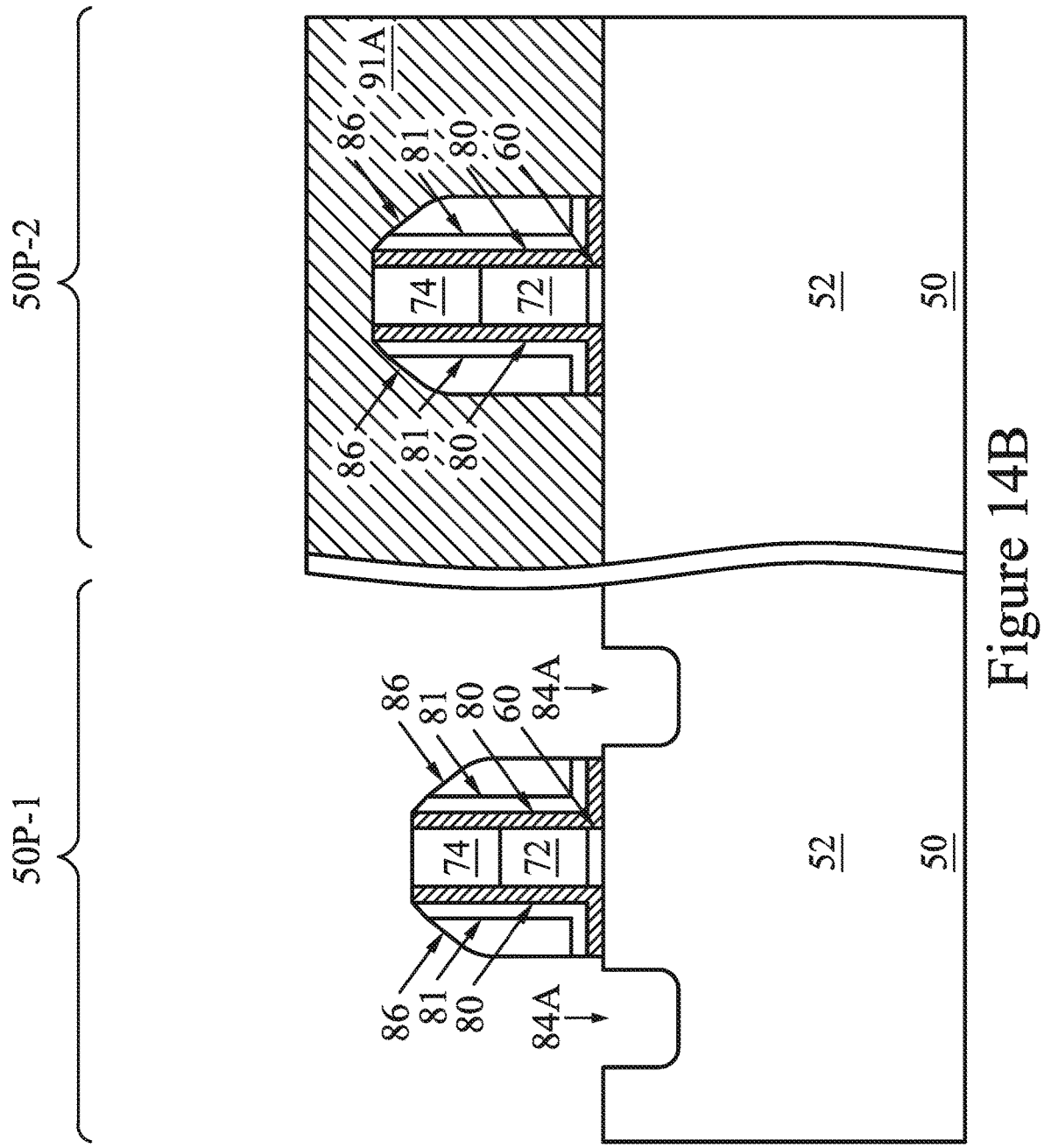

Turning to FIGS. 14A-B, recesses 84A are formed in the fins 52 of the subregion 50P-1, in accordance with some embodiments. The recesses 84A may be formed using, for example, an anisotropic dry etching process. In some cases, portions of the first spacers 80, second spacers 81, or sidewall spacers 86 may also be etched by the anisotropic dry etching process. The example etching of the spacers 80, 81, and 86 shown in FIG. 14A is intended to be illustrative, and the anisotropic dry etching process may etch the spacers 80, 81, or 86 differently in other embodiments. For example, in other embodiments, the anisotropic dry etching process may etch portions of the spacers 80, 81, and 86 different amounts such that one or more of the spacers 80, 81, or 86 extends higher above the STI regions 56 than another of the spacers 80, 81, or 86. These and other variations are intended to be within the scope of this disclosure. In some embodiments, the process parameters of the anisotropic dry etching process may be controlled in order to etch the recesses 84A or spacers 80, 81, or 86 to have desired characteristics. The process parameters may include, for example, a process gas mixture, a voltage bias, an RF power, a process temperature, a process pressure, other parameters, or a combination thereof. In some cases, the shape, volume, size, or other characteristics of the epitaxial source/drain regions 82A (see FIGS. 18A-B) formed in the recesses 84A may be controlled by controlling the etching of the recesses 84A or spacers 80, 81, or 86 in this manner.

Figure 15A:
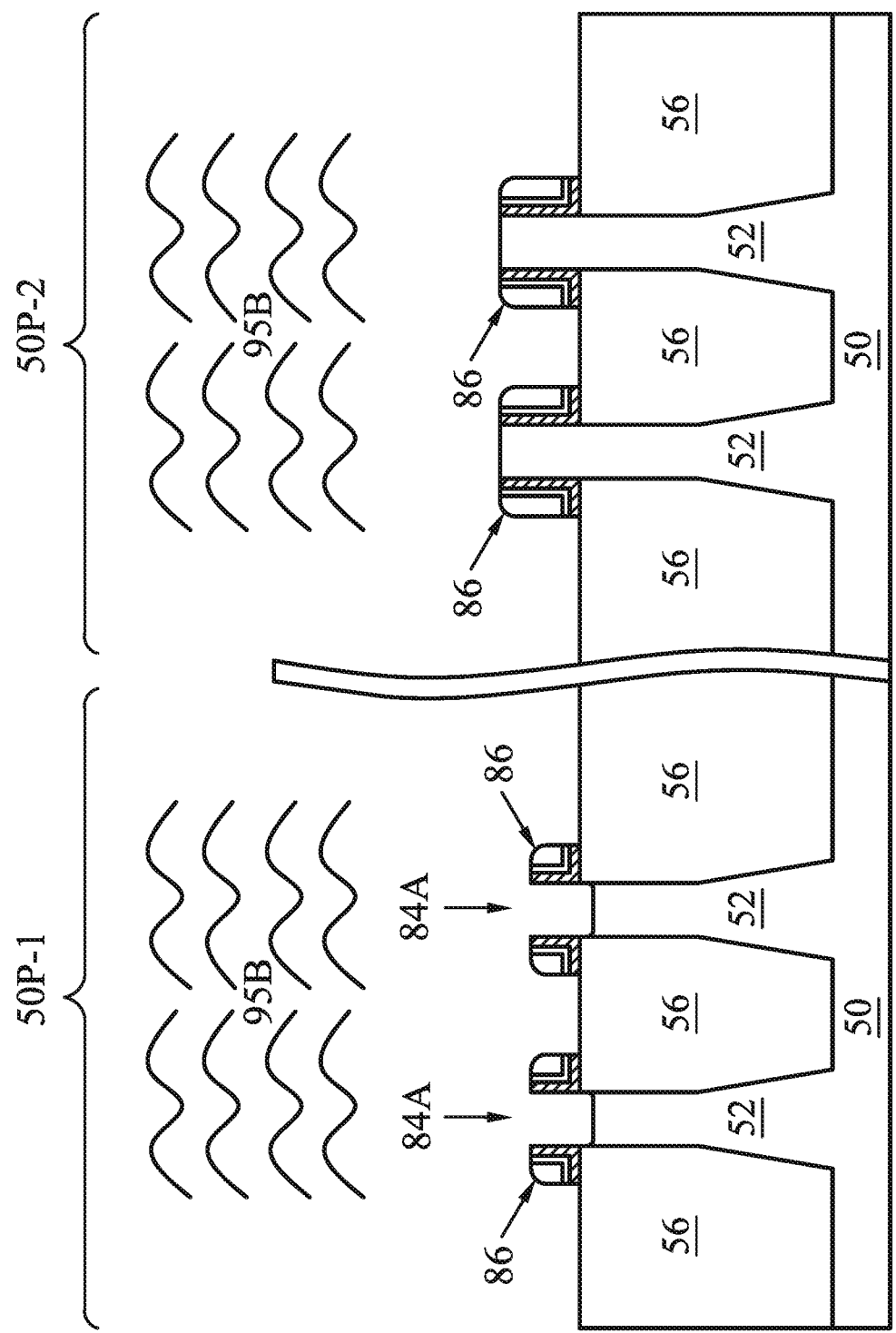
FIGS. 15A and 15B are cross-sectional views of a second wet cleaning process in an intermediate stage in the manufacturing of FinFETs, in accordance with some embodiments.
Figure 15B:
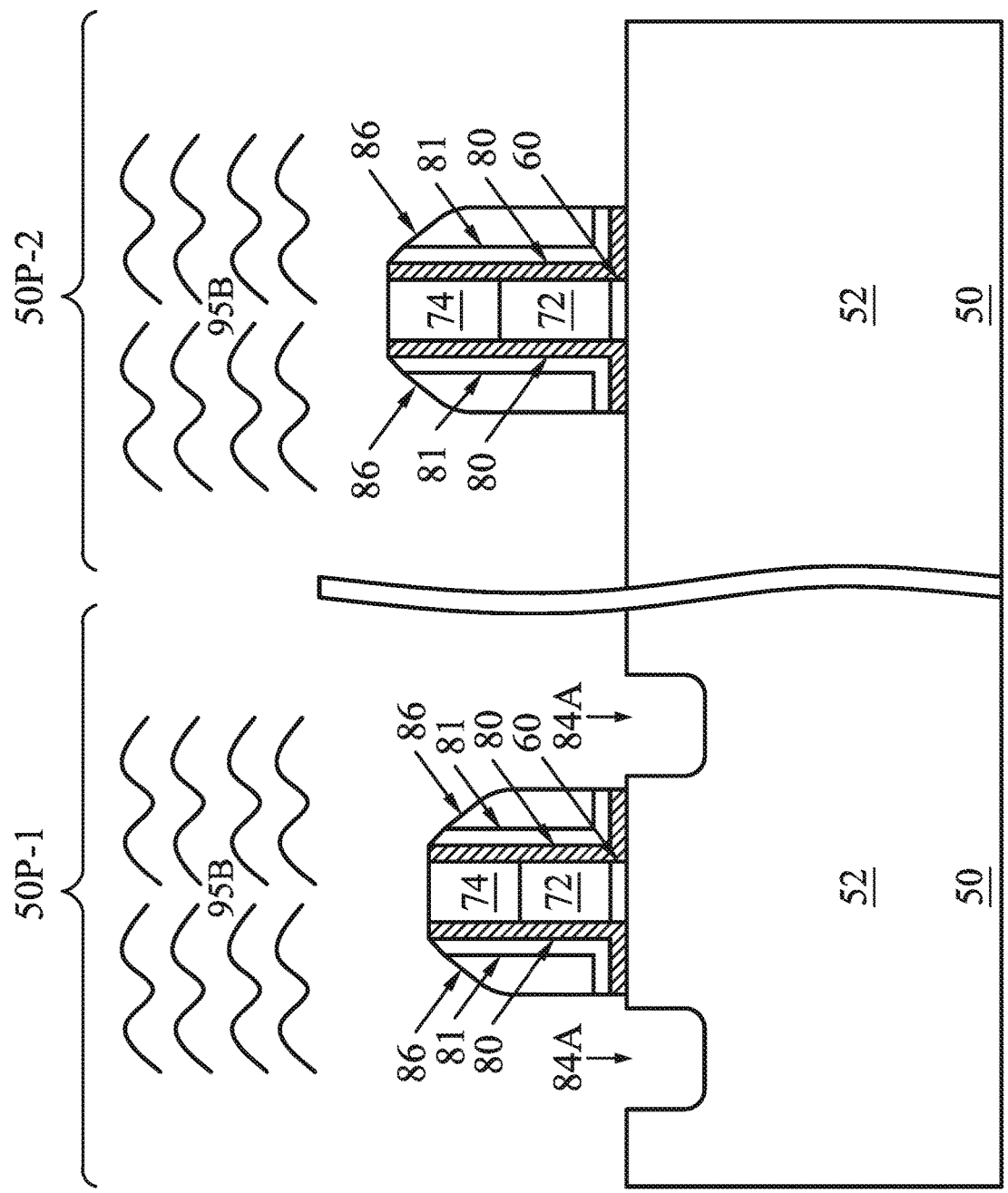

Turning to FIGS. 15A-B, the mask 91A is removed and a second wet cleaning process 95B is performed. The mask 91A may be removed using a suitable process, such as a wet chemical process or a dry process. After removal of the mask 91A, the second wet cleaning process 95B is performed to remove residue and prepare the surfaces of the structure for formation of the mask 91B (see FIGS. 16A-B). In some embodiments, the mask 91A is removed as part of performing the second wet cleaning process 95B. The second wet cleaning process 95B may be similar to the first wet cleaning process 95A (see FIGS. 12A-B). For example, the second wet cleaning process 95B may use a heated mixture of sulfuric acid and hydrogen peroxide. The mixture may have a composition similar to those described for the first wet cleaning process 95A, and may be heated to a similar temperature. In other cases, the second wet cleaning process 95B may be a mixture of sulfuric acid and hydrogen peroxide that is different than that used for the first wet cleaning process 95A, and that may be heated to a different temperature. Similar to the first wet cleaning process 95A, using a heated mixture of sulfuric acid and hydrogen peroxide may reduce damage to silicon oxycarbide layers, such as embodiments in which the first spacers 80 and/or the second spacers 81 are formed of silicon oxycarbide.

Figure 16A:
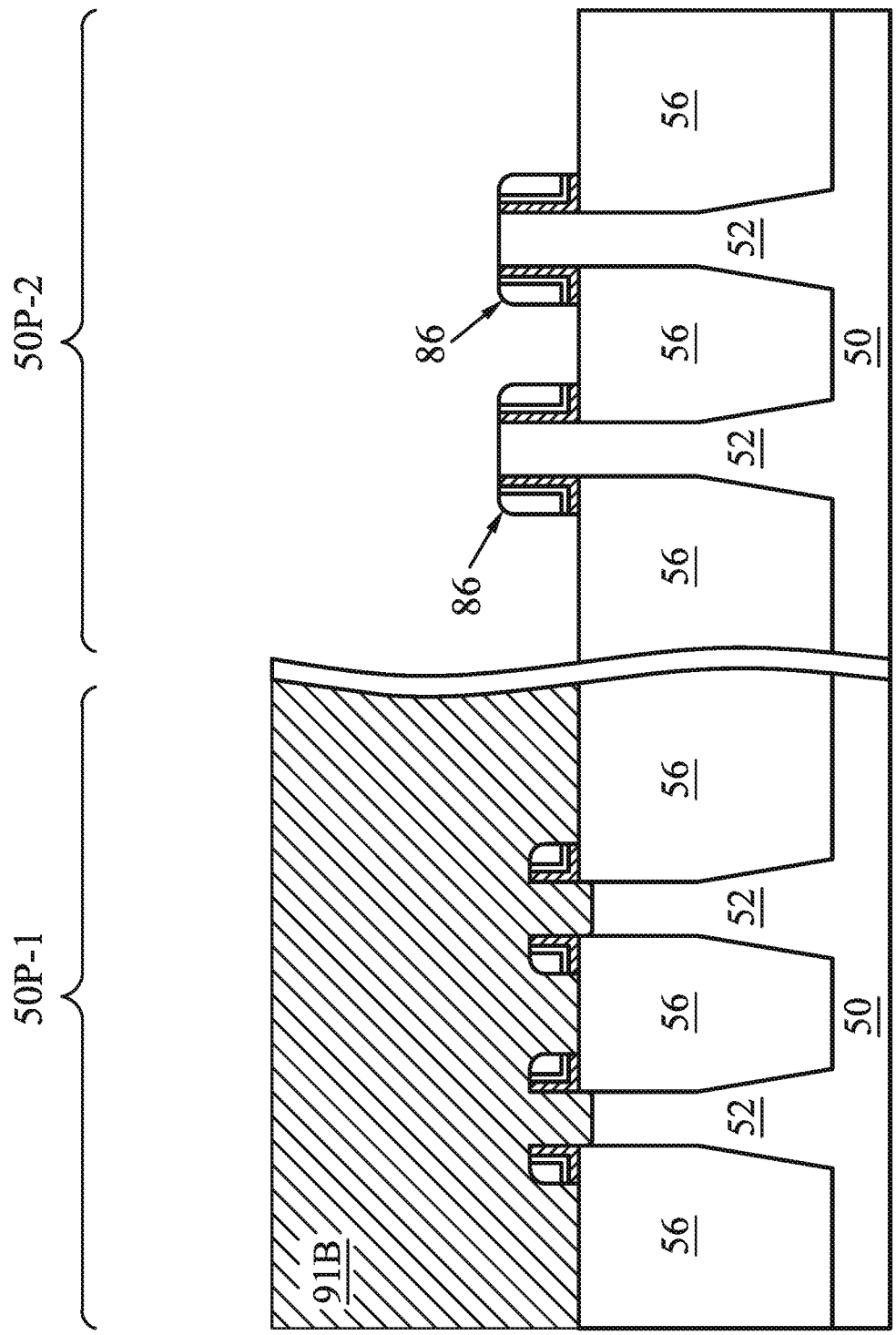
FIGS. 16A, 16B, 17A, 17B, 18A, and 18B are cross-sectional views of intermediate stages in the manufacturing of FinFETs, in accordance with some embodiments.
Figure 16B:
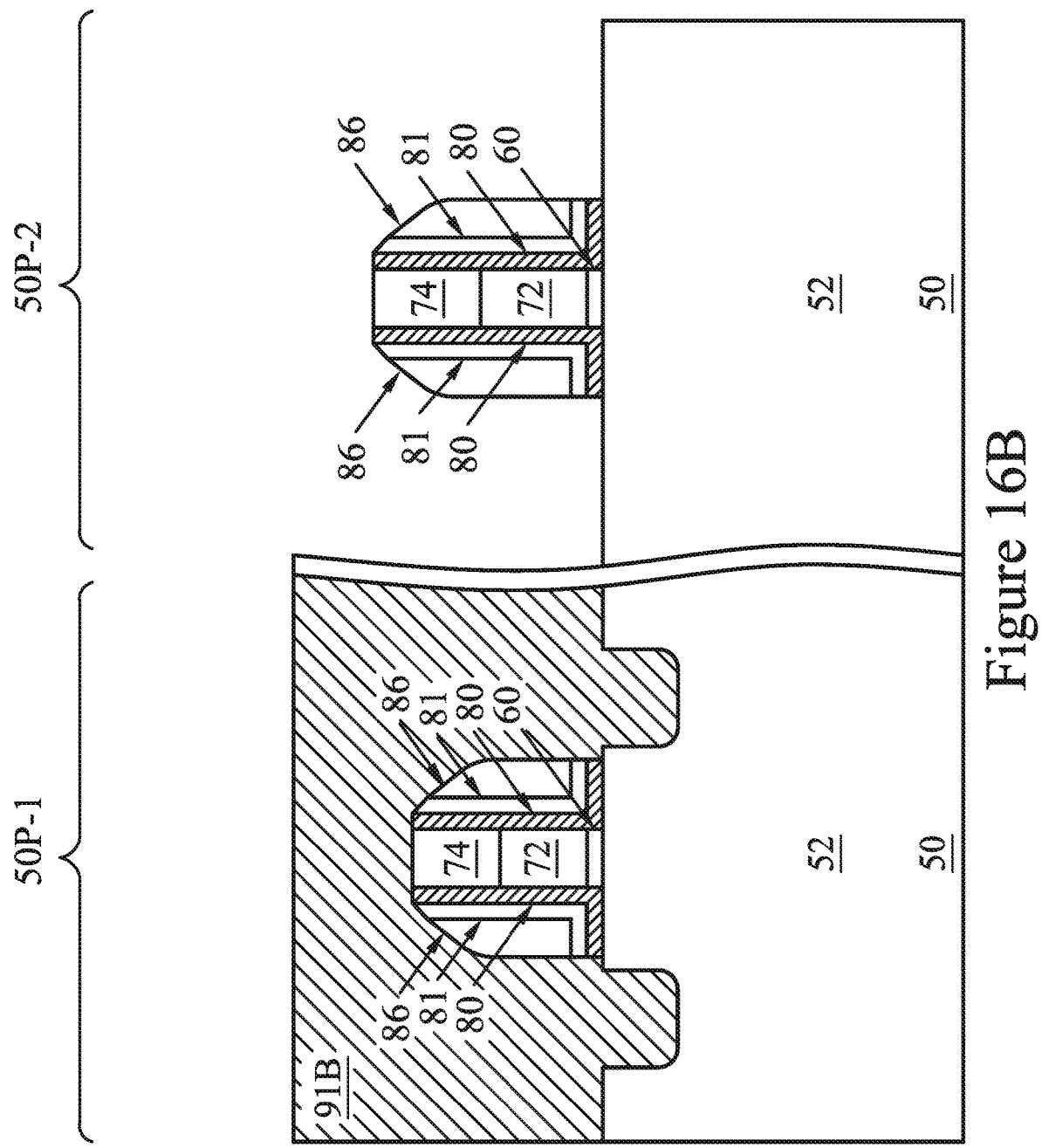

Turning to FIGS. 16A-B, a mask 91B is formed over the subregion 50P-1. The mask 91B may include a single layer or may be a multi-layer structure (e.g., a bi-layer structure, a tri-layer structure, or having more than three layers). The mask 91A may include materials such as photoresist materials, oxide materials, nitride materials, other dielectric materials, the like, or a combination thereof. In some embodiments, the mask 91B includes a bottom anti-reflective coating (BARC). The mask 91B may be formed using one or more suitable techniques, such as spin-on techniques, CVD, PE-CVD, ALD, PVD, sputtering, the like or a combination. The mask 91B may be patterned to expose portions of the subregion 50P-2 using suitable photolithographic and etching processes. For example, one or more wet etching processes or anisotropic dry etching processes may be used to etch the mask 91B. The mask 91B may be similar to mask 91A (see FIGS. 13A-B) or different than mask 91A.

Figure 17A:
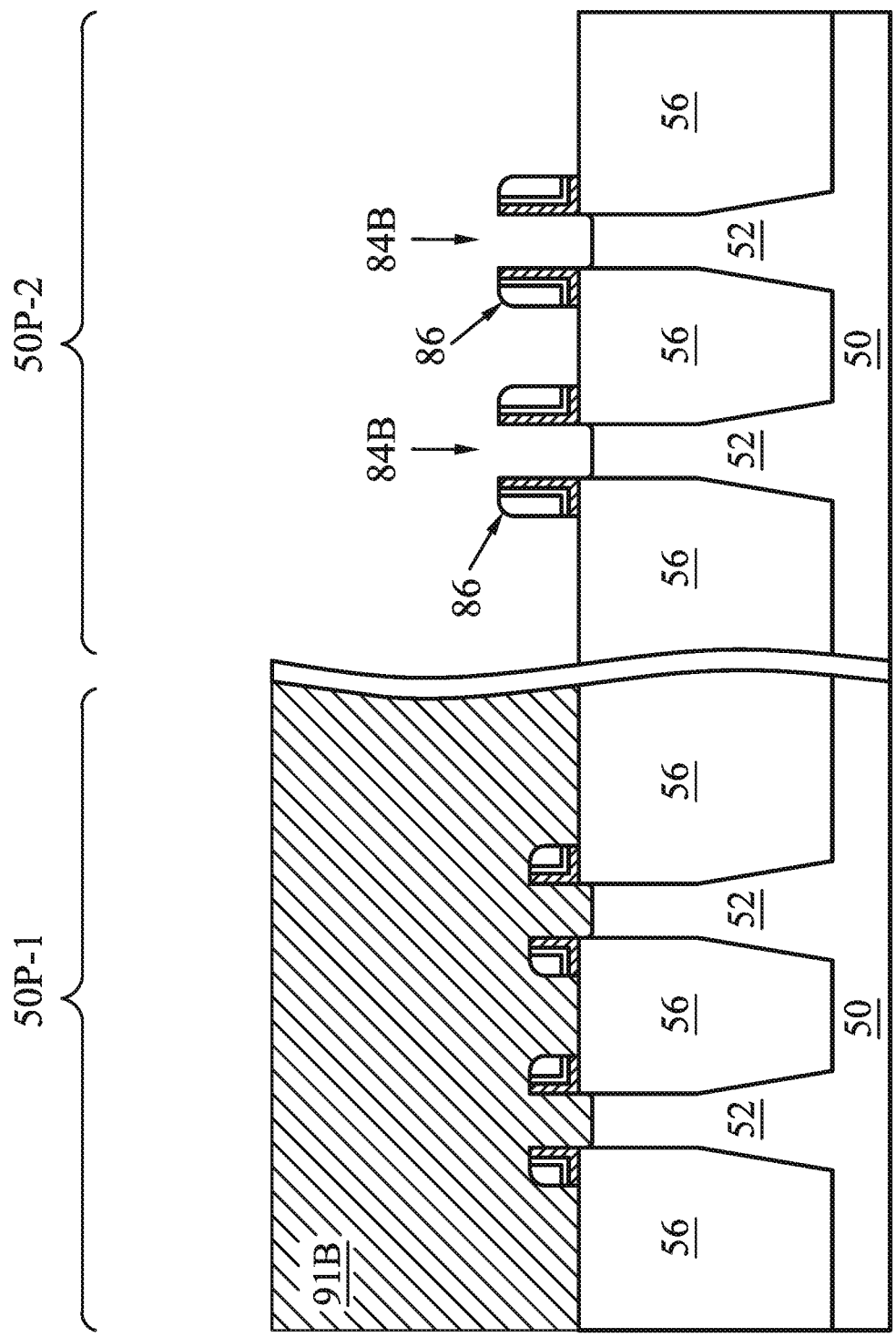
Figure 17B:
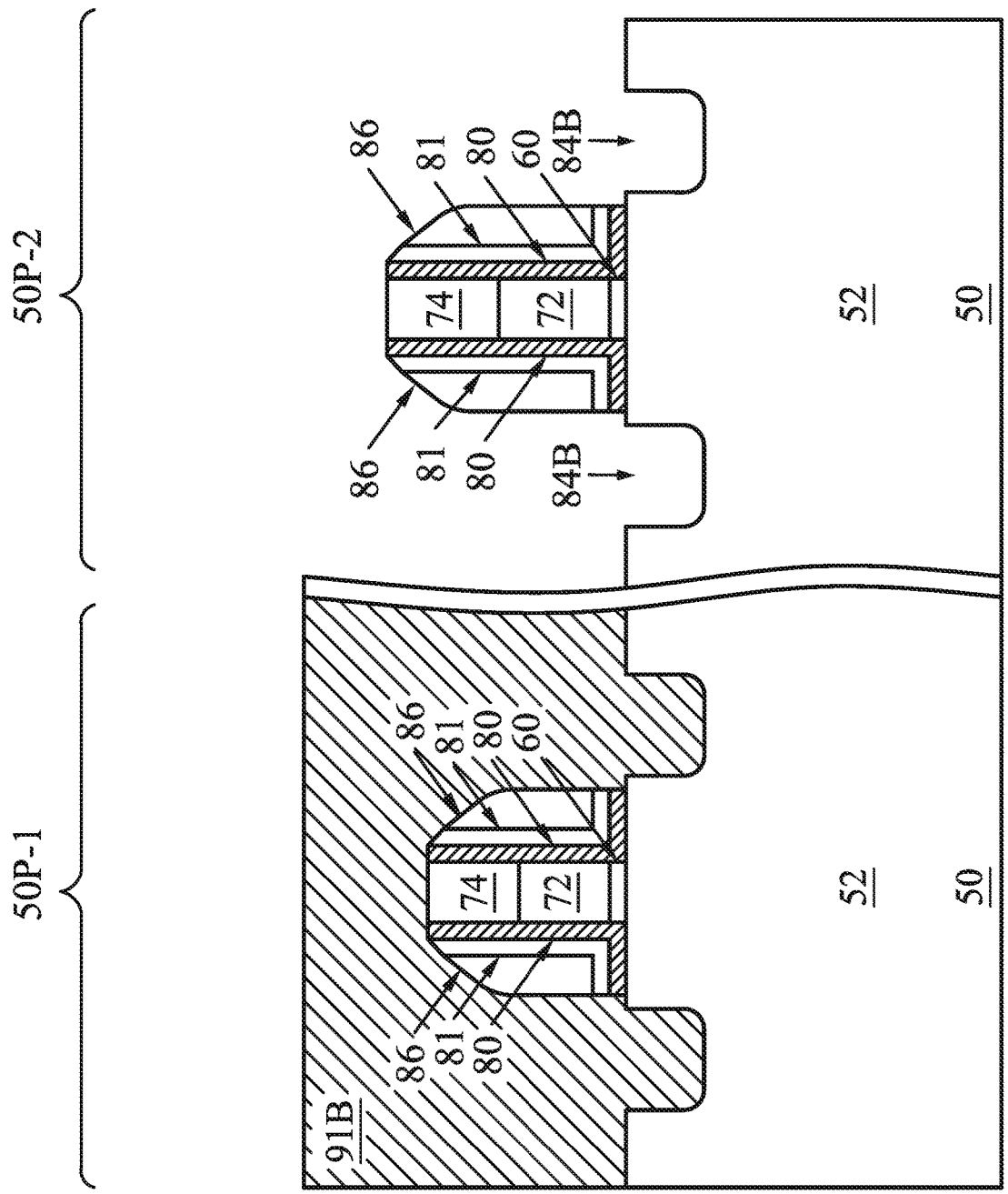

Turning to FIGS. 17A-B, recesses 84B are formed in the fins 52 of the subregion 50P-2, in accordance with some embodiments. The recesses 84B may be formed using, for example, an anisotropic dry etching process. In some cases, portions of the first spacers 80, second spacers 81, or sidewall spacers 86 may also be etched by the anisotropic dry etching process. In some embodiments, the process parameters of the anisotropic dry etching process may be controlled in order to etch the recesses 84B or spacers 80, 81, or 86 to have desired characteristics. The process parameters of the etching for subregion 50P-2 may be different than the process parameters of the etching for subregion 50P-1. The process parameters may include, for example, a process gas mixture, a voltage bias, an RF power, a process temperature, a process pressure, other parameters, or a combination thereof. In some embodiments, the process parameters may be controlled such that the recesses 84B in subregion 50P-2 are different (e.g., have different a depth, width, shape, etc.) than the recesses 84A in subregion 50P-1. The process parameters may also be controlled such that the spacers 80, 81, or 86 in subregion 50P-2 are different (e.g., have different heights, widths, shapes, etc.) than the spacers 80, 81, or 86 in subregion 50P-1. These are examples, and these and other variations are intended to be within the scope of this disclosure. In some cases, the shape, volume, size, or other characteristics of the epitaxial source/drain regions 82B (see FIGS. 18A-B) formed in the recesses 84B may be controlled by controlling the etching of the recesses 84B or spacers 80, 81, or 86 in this manner. By using separate and different etching processes within subregion 50P-1 and subregion 50P-2, the epitaxial source/drain regions in each subregion may be formed having different characteristics.

Figure 18A:
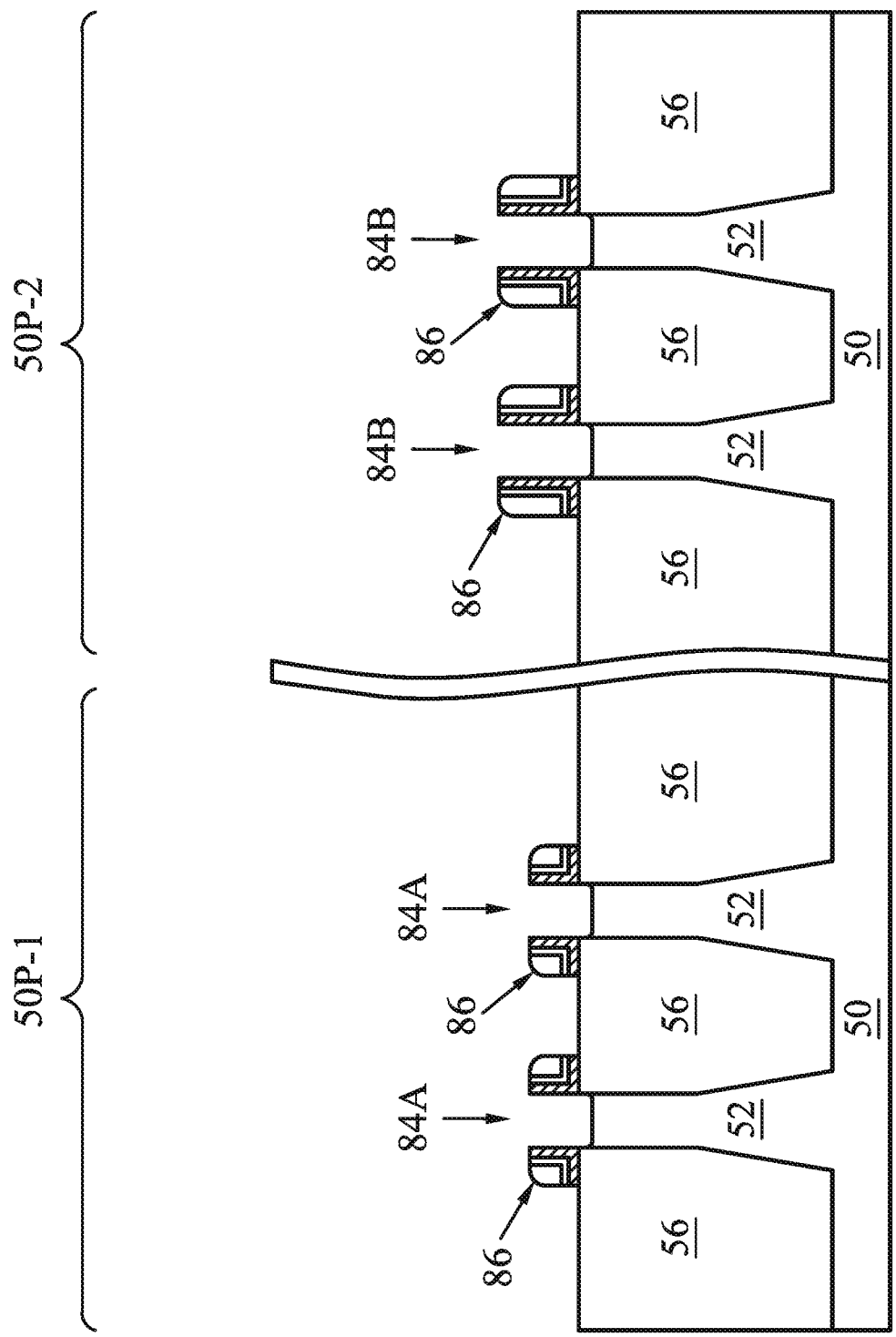
Figure 18B:
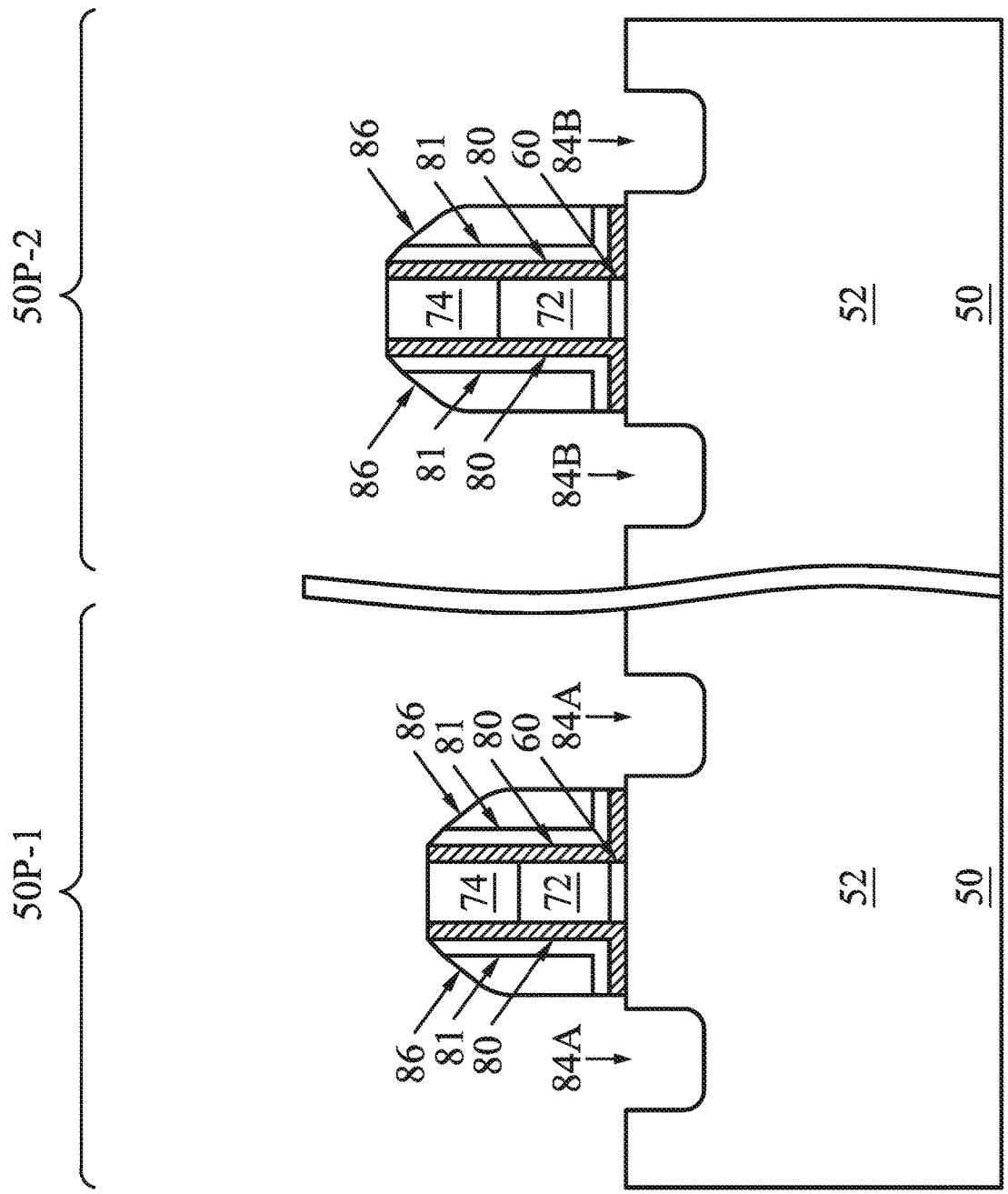

Turning to FIGS. 18A-B, the mask 91B is removed. The mask 91B may be removed using a suitable process, such as a wet chemical process or a dry process. In this manner, the source/drain regions of subregions 50P-1 and 50P-2 may be prepared for formation of epitaxial source/drain regions 82A-B (see FIGS. 19A-B). As described in FIGS. 12A-18B, a multipatterning process may be used to etch different subregions differently. In some embodiments, the multipatterning process may be a "2P2E" process such as that described in FIGS. 12A-18B, in which a first subregion (e.g. subregion 50P-2) is masked while a second subregion (e.g., subregion 50P-1) is etched, and then the second subregion is masked while the first subregion is etched. In other embodiments, subregion 50P-1 may be masked and subregion 50P-2 etched first, before subregion 50P-2 is masked and subregion 50P-1 is etched. By masking and etching appropriate subregions in sequence, more than two subregions may be etched in this manner using different etching processes. Additionally, by using a wet cleaning process similar to wet cleaning processes 95A-B, a wet cleaning process may be performed before each masking step with less chance of damage to layers formed of silicon oxycarbide.

Figure 19A:
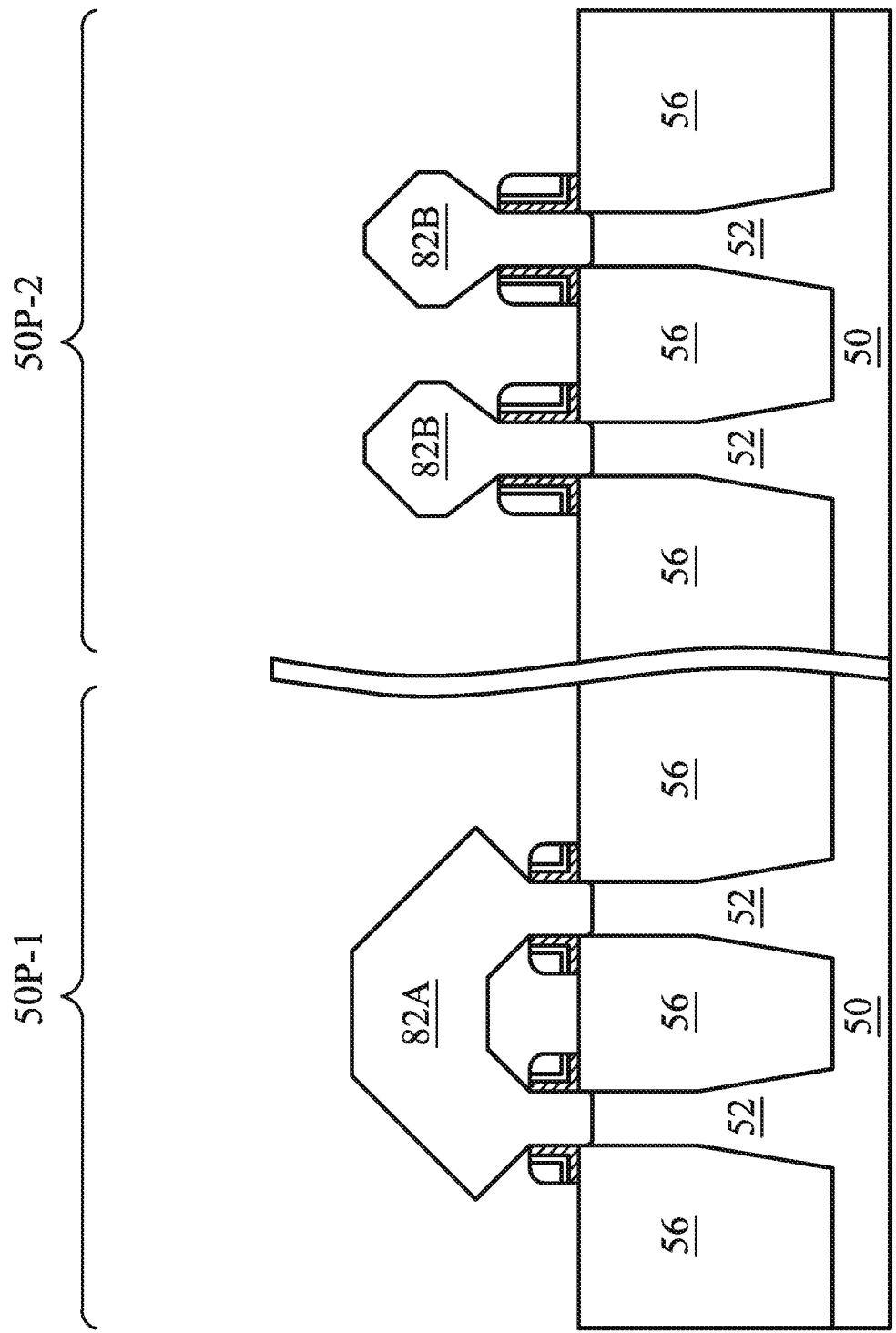
FIGS. 19A-B are cross-sectional views of the formation of epitaxial source/drain regions in an intermediate stage in the manufacturing of FinFETs, in accordance with some embodiments.
Figure 19B:
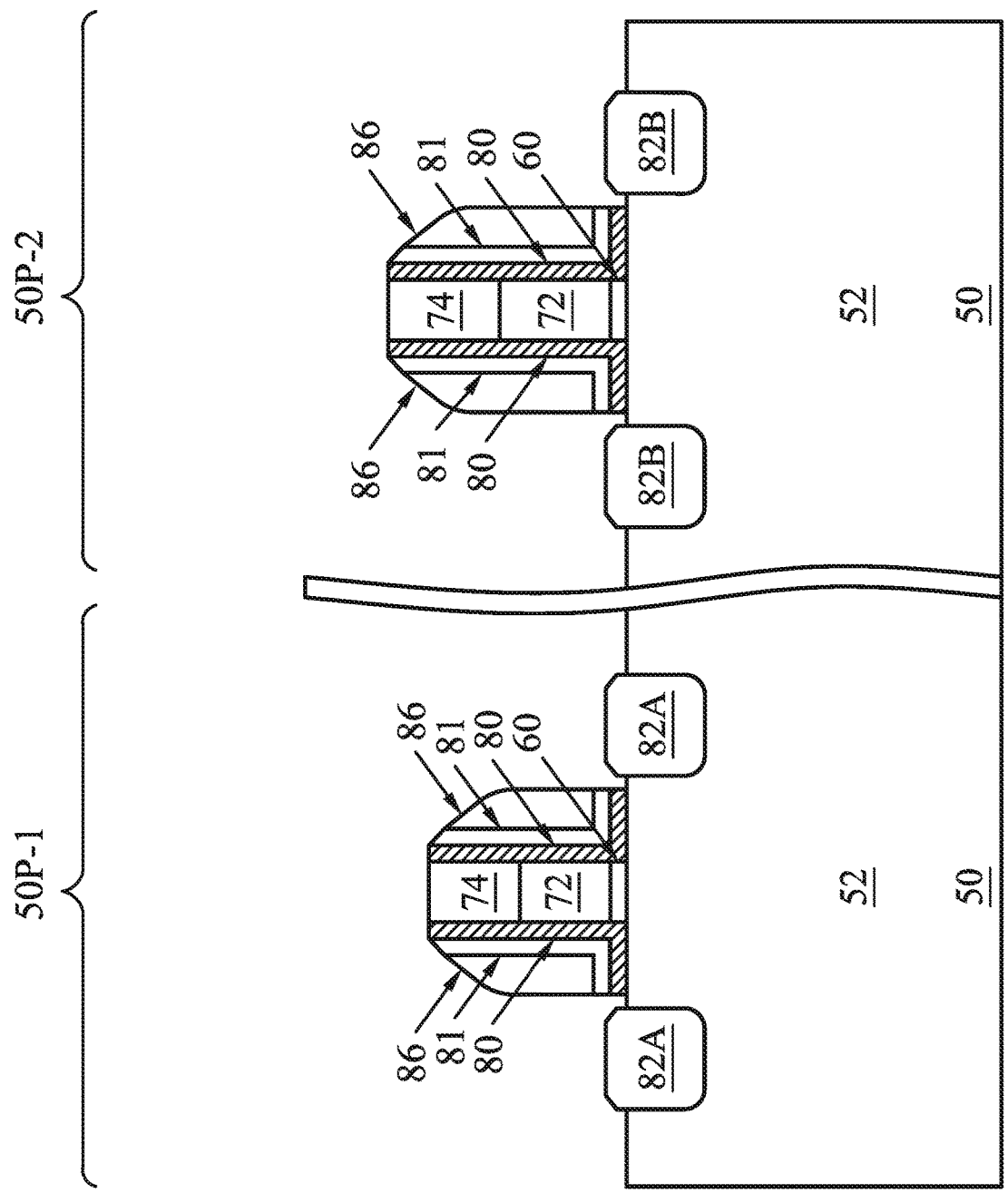

Turning to FIGS. 19A-B, epitaxial source/drain regions 82 are formed in the region 50P, in accordance with some embodiments. In some embodiments, a pre-clean process may first be performed to remove oxide (e.g., native oxide) from the recesses 84A-B. The pre-clean process may include a wet chemical process (e.g., dilute HF), a plasma process, or a combination. Using the same epitaxial process, epitaxial source/drain regions 82A are formed in the recesses 84A of subregion 50P-1 and epitaxial source/drain regions 82B are formed in the recesses 84B of subregion 50P-2. In some embodiments, additional epitaxial source/drain regions may be formed in other subregions, if any, using the same epitaxial process as epitaxial source/drain regions 82A-B. The epitaxial source/drain regions 82A-B may include any acceptable material, such as appropriate for p-type FinFETs. For example, if the fin 52 is silicon or SiGe, the epitaxial source/drain regions 82A-B may comprise SiGe, SiGeB, Ge, GeSn, other materials, the like, or a combination thereof.

In some embodiments, a single epitaxial process may form different epitaxial source/drain regions in different subregions. The epitaxial source/drain regions may be different due to different etching processes performed in subregions forming differences in recesses (e.g., recesses 84A-B) or differences in spacers (e.g., spacers 80, 81 or 86) in the subregions. For example, as shown in FIG. 19A, the epitaxial source/drain regions 82A formed in the recesses 84A of subregion 50P-1 merge together during epitaxy into a single epitaxial source/drain region 82A, but the epitaxial source/drain regions 82B formed in the recesses 84B of subregion 50P-2 remain unmerged. In this manner, the epitaxial source/drain regions 82A are formed having a larger volume than the epitaxial source/drain regions 82B.

The merged epitaxial source/drain regions 82A and unmerged epitaxial source/drain regions 82B shown in FIGS. 19A-B are intended as an illustrative example of different epitaxial source/drain regions formed in different subregions using the same epitaxial process, and these and other variations are intended to be within the scope of this disclosure. In other embodiments, epitaxial source/drain regions formed in different subregions may be different in other ways, such as height, width, shape, volume, profile, etc. In this manner, FinFET devices having different epitaxial source/drain regions may be formed in different subregions and using the same epitaxial process. For example, logic devices may be formed in a first subregion (e.g., subregion 50P-1) and SRAM devices may be formed in a second subregion (e.g., subregion 50P-2). These are examples, and other types of devices are possible.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N may be epitaxially grown in the recesses. The epitaxial source/drain regions 82 in the region 50N may be formed before or after forming the epitaxial source/drain regions 82 in the region 50P (e.g., before or after forming epitaxial source/drain regions 82A-B shown in FIGS. 19A-B). The epitaxial source/drain regions 82 of the region 50N may include any acceptable material, such as appropriate for n-type FinFETs. For example, if the fin 52 is silicon, the epitaxial source/drain regions 82 in the region 50N may include silicon, SiC, SiCP, SiP, or the like. The epitaxial source/drain regions 82 in the region 50N may have surfaces raised from respective surfaces of the fins 52, may be merged or unmerged, or may have facets.

In some embodiments, the region 50N may include subregions, and a multipatterning process of masking and etching separate subregions may be used prior to forming epitaxial source/drain regions 82 in the region 50N. The multipatterning process may be similar to the multipatterning process performed for the subregions 50P-1 and 50P-2 of the region 50P as described in FIGS. 12A-18B. In this manner, different epitaxial source/drain regions may be formed in different subregions using the same epitaxial process, and thus different FinFET devices (e.g., SRAM devices, logic devices, etc.) may be formed in different subregions. In some embodiments, the multipatterning process may include one or more wet cleaning processes similar to wet cleaning processes 95A-B described previously. In this manner, silicon oxycarbide may be used for first spacers 80 and second spacers 81 in the region 50N with less chance of damage during a multipatterning process. In some embodiments, the sidewall spacers 86 may be removed after forming the epitaxial source/drain regions in regions 50N or 50P or in subregions thereof. The sidewall spacers 86 may be removed using, for example, an anisotropic dry etch.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 20B:
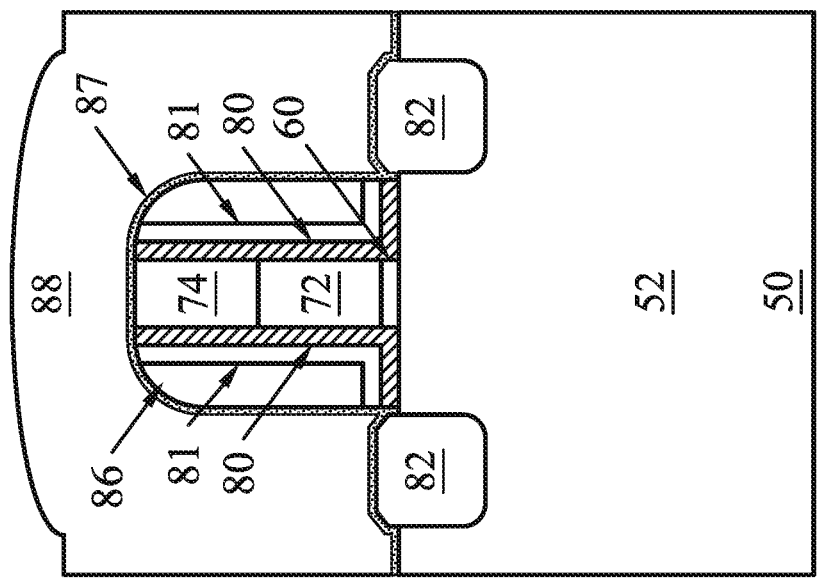
FIGS. 20A, 20B, 21A, 21B, 22A, 22B, 23A, 23B, 24, 25A, 25B, 26A, and 26B are cross-sectional views of intermediate stages in the manufacturing of FinFETs, in accordance with some embodiments.
Figure 20A:
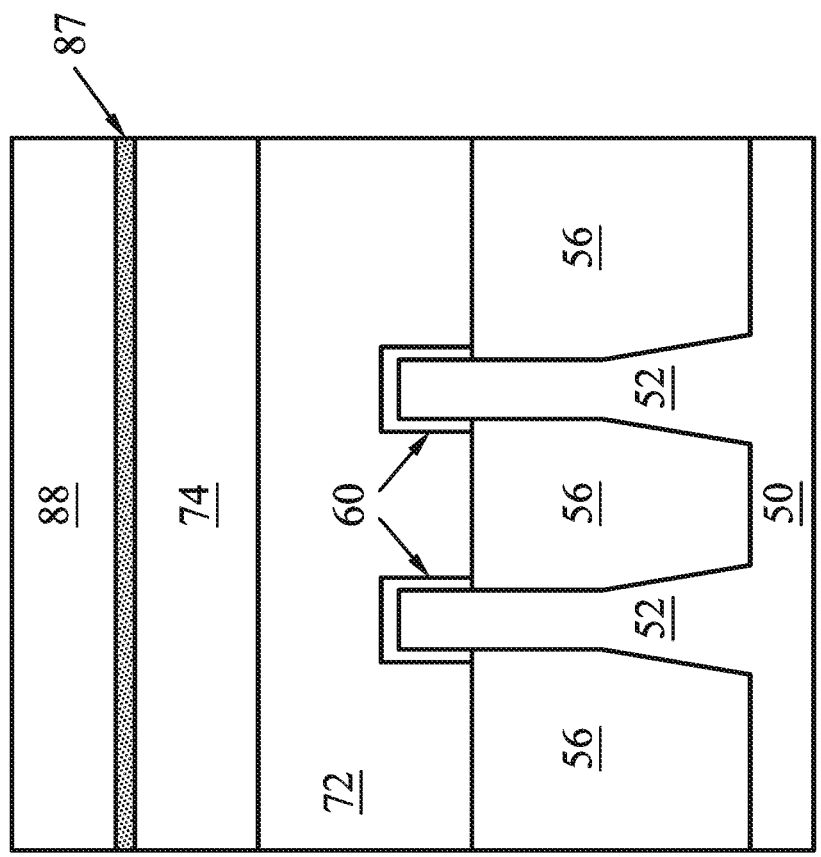

Turning to FIGS. 20A and 20B, an ILD 88 is deposited over the region 50N and the region 50P. The structure shown in FIGS. 20A-B is an example structure following formation of epitaxial source/drain regions 82, and the processing steps described may be applicable to any of the structures, embodiments, or devices previously described. The ILD 88 may be formed of a dielectric material or a semiconductor material, and may be deposited by any suitable method, such as CVD, plasma-enhanced CVD (PECVD), or FCVD.

Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure germanium, or the like. Other insulation or semiconductor materials formed by any acceptable process may be used. In some embodiments, a contact etch stop layer (CESL) 87 is disposed between the ILD 88 and the epitaxial source/drain regions 82, the hard mask 74, and the sidewall spacers 86. The CESL 87 may comprise a dielectric material such as silicon nitride, silicon oxide, silicon oxynitride, the like, or a combination thereof.

Figure 21B:
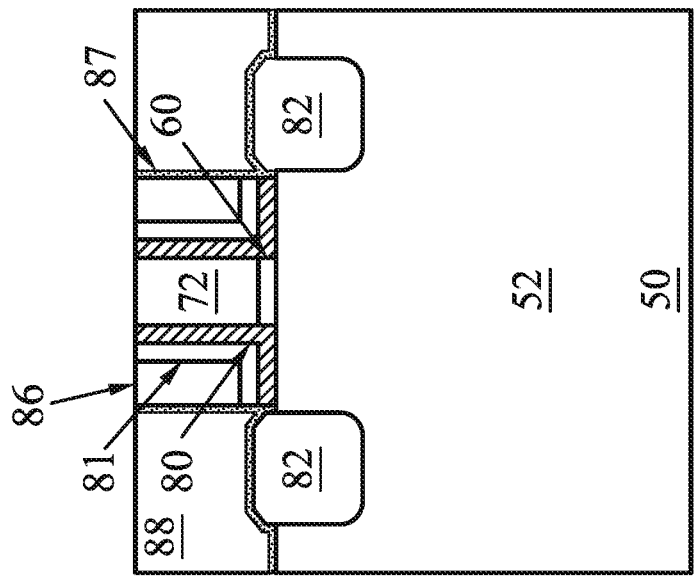
Figure 21A:
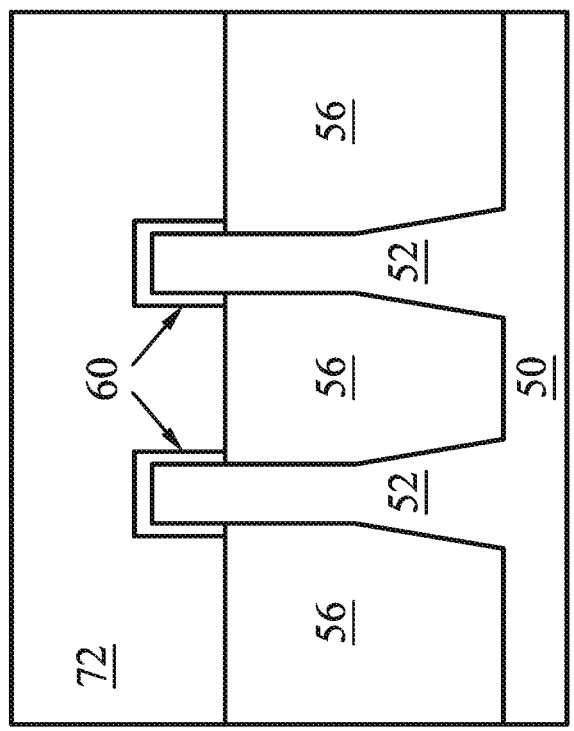

In FIGS. 21A and 21B, a planarization process, such as a CMP, may be performed to level the top surface of the ILD 88 with the top surfaces of the dummy gates 72. The planarization process may also remove the masks 74 on the dummy gates 72, and may also remove portions of the first spacers 80, second spacers 81, and the sidewall spacers 86 along sidewalls of the masks 74. After the planarization process, top surfaces of the dummy gates 72, the first spacers 80, second spacers 81, the sidewall spacers, and the ILD 88 are level. Accordingly, the top surfaces of the dummy gates 72 are exposed through the ILD 88.

Figure 22B:
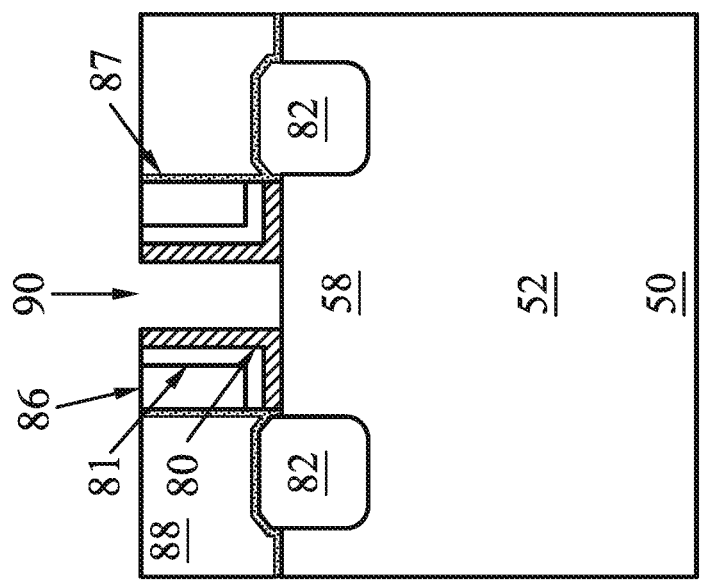
Figure 22A:
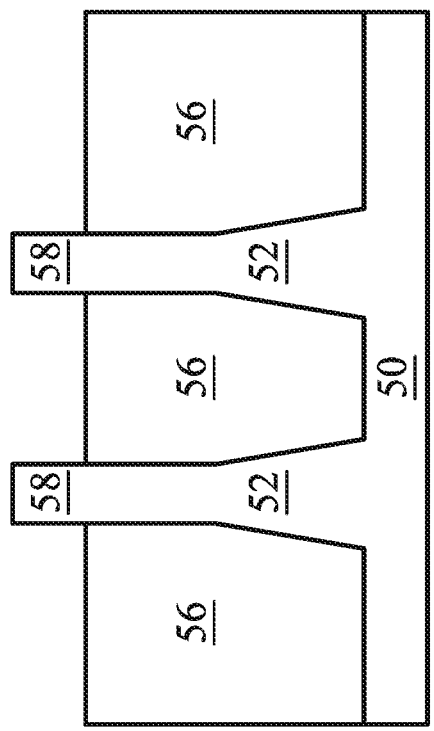

In FIGS. 22A and 22B, the dummy gates 72 and portions of the dummy dielectric layer 60 directly underlying the exposed dummy gates 72 are removed in one or more etching steps, so that recesses 90 are formed. In some embodiments, the dummy gates 72 are removed by an anisotropic dry etch process. For example, the etching process may include a dry etch process using one or more process gases that selectively etch the dummy gates 72 without etching the ILD 88 or the gate spacers 86. Each recess 90 exposes a channel region of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 23B:
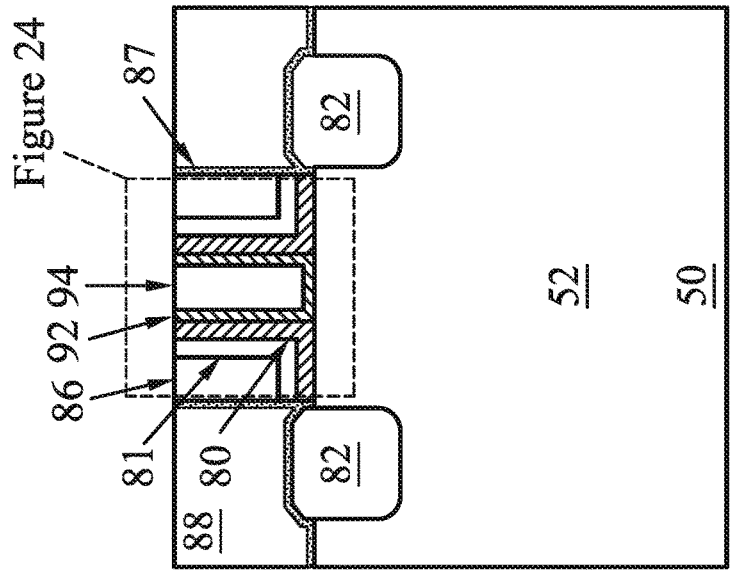
Figure 23A:
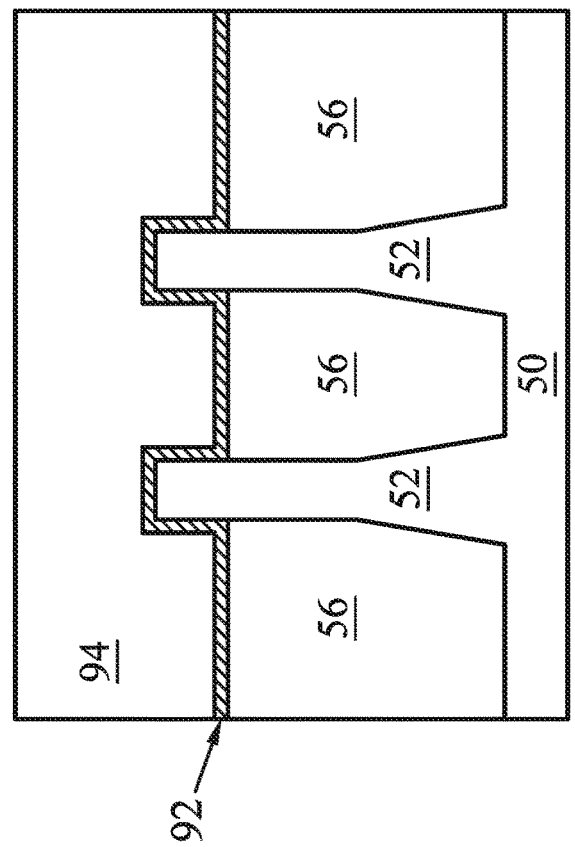
Figure 24:
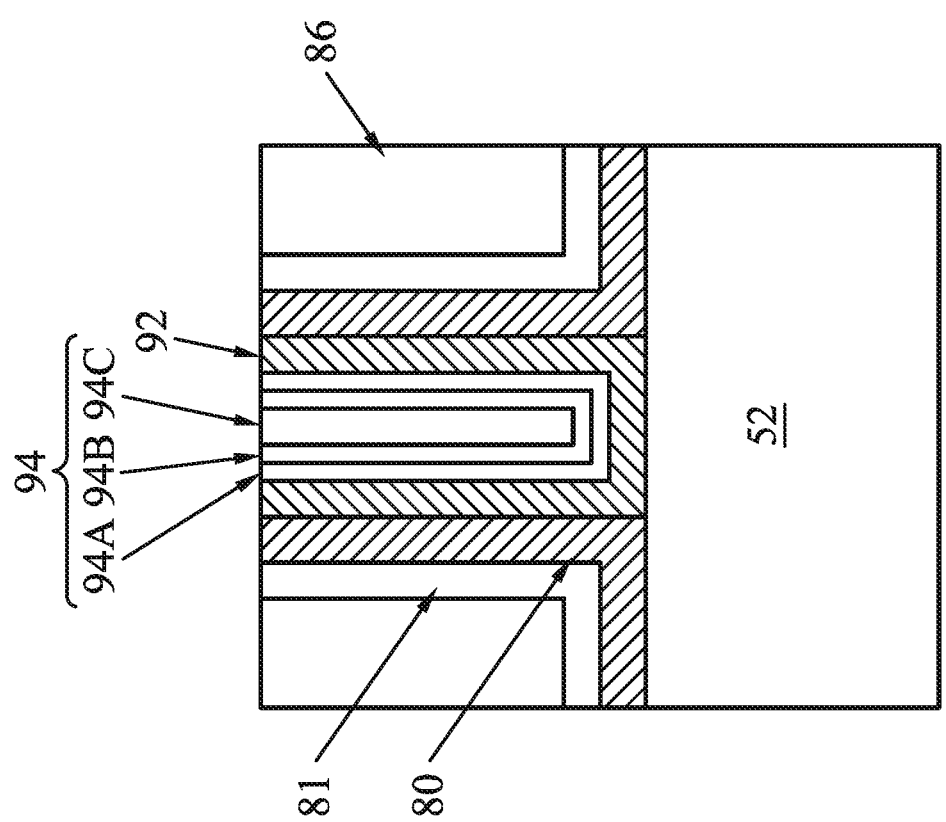

In FIGS. 23A and 23B, gate dielectric layers 92 and gate electrodes 94 are formed for replacement gates, in accordance with some embodiments. FIG. 24 illustrates a detailed view of FIG. 23B, as indicated. Gate dielectric layers 92 are deposited conformally in the recesses 90, such as on the top surfaces and the sidewalls of the fins 52 and on sidewalls of the first spacers 80. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments in which portions of the dummy gate dielectric 60 remains in the recesses 90, the gate dielectric layers 92 include a material of the dummy gate dielectric 60 (e.g., silicon oxide).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIG. 23B, the gate electrode 94 may comprise any number of liner layers 94A, any number of work function tuning layers 94B, and a fill material 94C as illustrated by FIG. 24. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 25B:
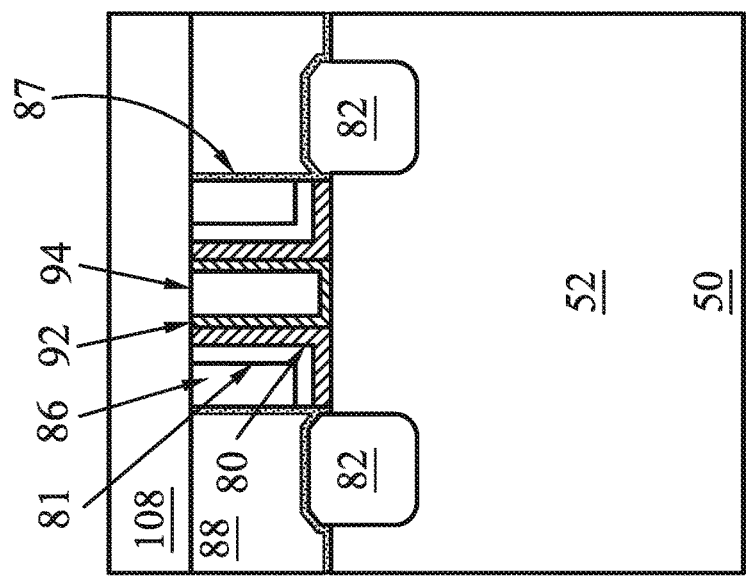
Figure 25A:
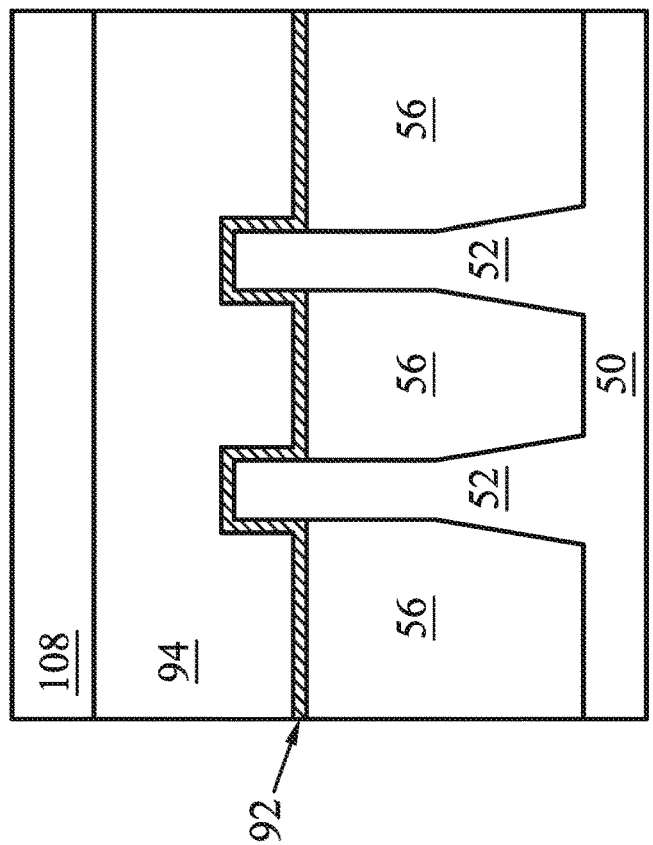

In FIGS. 25A and 25B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD, PE-CVD, or the like.

Figure 26B:
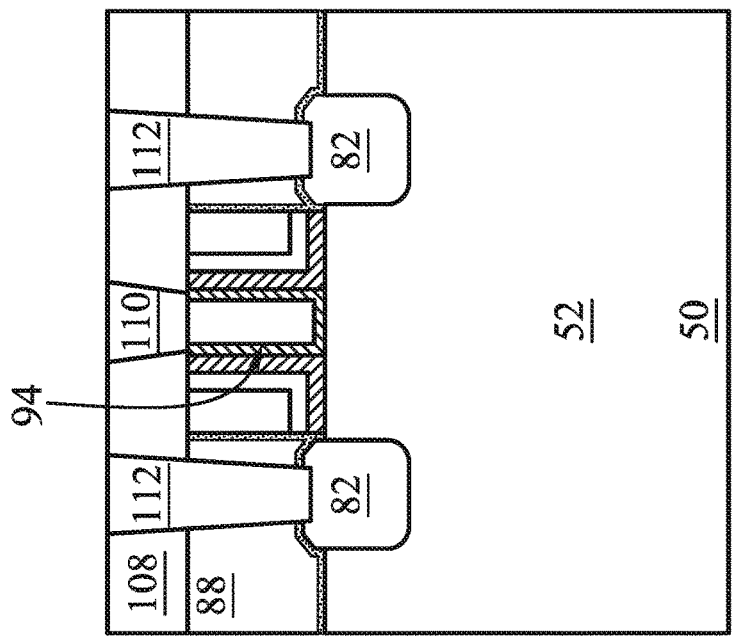
Figure 26A:
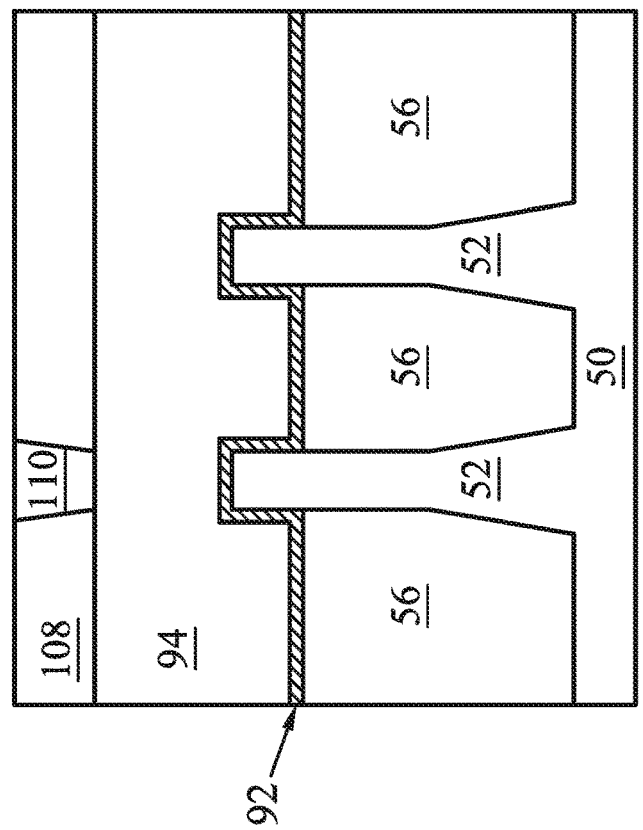

In FIGS. 26A and 26B, contacts 110 and 112 are formed through the ILD 108 and the ILD 88, in accordance with some embodiments. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 26A-B illustrate the contacts 110 and 112 in a same cross-section; however, in other embodiments, the contacts 110 and 112 may be disposed in different cross-sections. Further, the position of contacts 110 and 112 in FIGS. 26A-B are merely illustrative and not intended to be limiting in any way. For example, the contact 110 may be vertically aligned with the fin 52 as illustrated or may be disposed at a different location on the gate electrode 94. Furthermore, the contacts 112 may be formed prior to, simultaneously with, or after forming the contacts 110.

Figure 27:
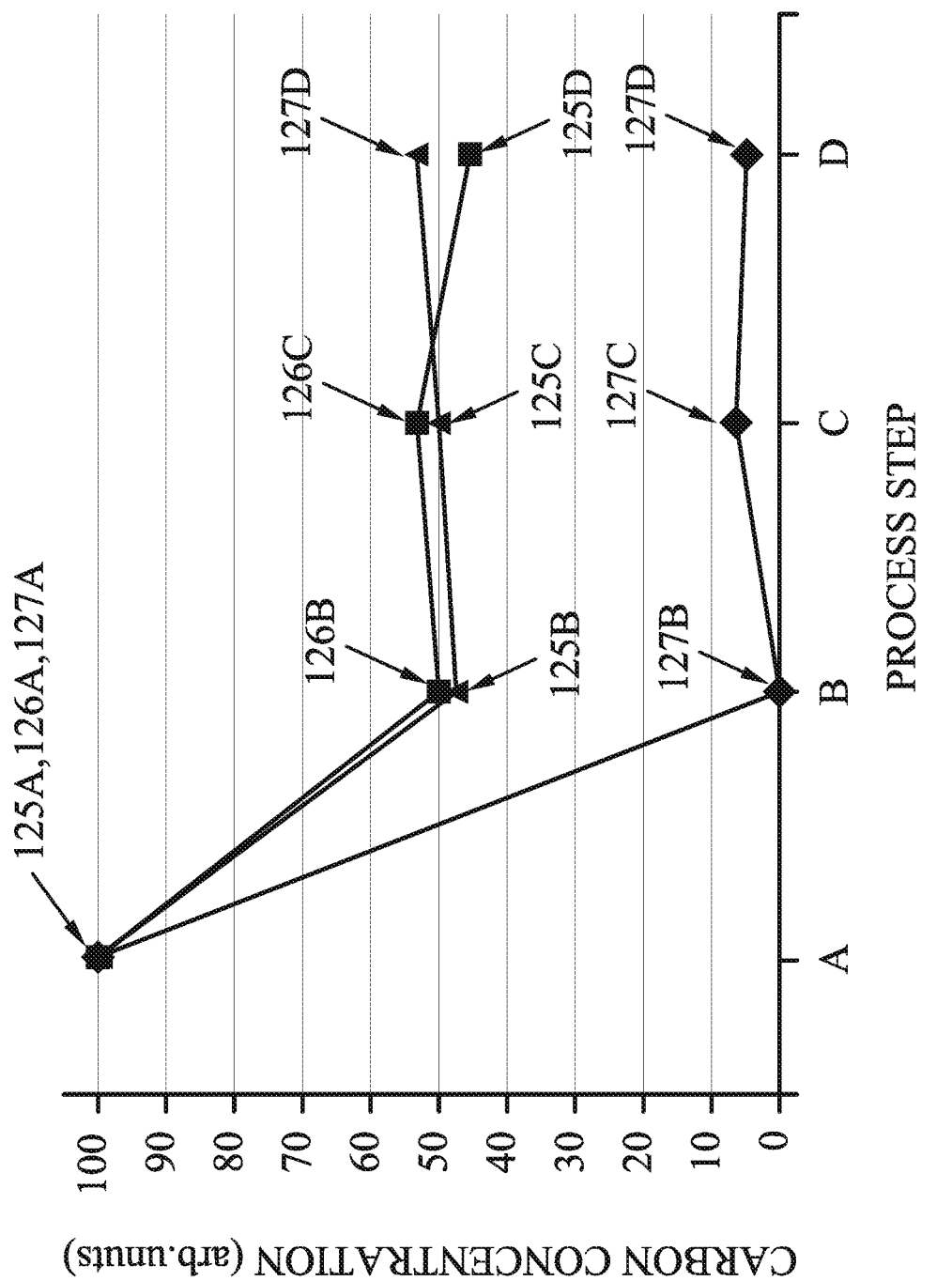
FIG. 27 is a graph showing experimental data of the change in carbon concentration of spacer layers of a FinFET device, in accordance with some embodiments.

Turning to FIG. 27, a graph shows experimental data of measurements of the carbon concentration present in the first spacers 80 and the second spacers 81 formed from a silicon oxycarbide material. FIG. 27 shows the carbon concentration measured after different processing steps, designated steps A, B, C, and D. In FIG. 27, points 125A-D show the carbon concentration of a first sample, points 126A-D show the carbon concentration of a second sample, and points 127A-D show the carbon concentration of a third sample. As described in greater detail below, the first wet cleaning process 95A and the second wet cleaning process 95B are used to clean the first sample (points 125A-D) and the second sample (points 126A-D), but an oxygen plasma process is used to clean the third sample (points 127A-D).

Processing step A corresponds to a step after the formation of the first spacers 80 and the second spacers 81, and as such points 125A, 126A, and 127A show the initial carbon concentration of the samples (e.g., as in FIGS. 11A-B).

Processing step B corresponds to a step after the 2P2E multipatterning process described in FIGS. 12A-18B has been performed. However, the first sample (points 125A-D) and the second sample (points 126A-D) used the first wet cleaning process 95A and the second wet cleaning process 95B described previously, whereas the third sample (points 127A-D) used separate oxygen plasma processes instead of the first wet cleaning process 95A and the second wet cleaning process 95B. As shown by points 125B and 126B, the wet cleaning processes 95A-B performed on the first sample and on the second sample reduced the carbon concentration of the first spacers 80 and second spacers 81 of the first and second samples to about 50% of the initial carbon concentration (points 125A and 126A). As shown by point 127B, the oxygen plasma processes performed on the third sample reduced the carbon concentration of the first spacers 80 and second spacers 81 to less than about 10% of the initial carbon concentration (point 127A). The reduction of carbon concentration is indicative of increased damage to the first spacers 80 and second spacers 81 from the oxygen plasma process. Thus, FIG. 27 shows that the use of the wet cleaning processes 95A-B can reduce the carbon concentration of an silicon oxycarbide material less than other types of cleaning processes. The data shown in FIG. 27 is an illustrative example, and the use of wet cleaning processes 95A-B may reduce the carbon concentration by a greater amount or by a smaller amount in other cases.

Processing step C corresponds to a step before a pre-clean process as described in FIGS. 19A-B has been performed. As shown, the first sample (point 125C), the second sample (point 126C), and the third sample (point 127C) maintain about the same carbon concentrations as at processing step B. Processing step D corresponds to a step before a epitaxial source/drain regions 82A-B as described in FIGS. 19A-B have been formed. As shown, the first sample (point 125D), the second sample (point 126D), and the third sample (point 127D) maintain about the same carbon concentrations as at processing step B and at processing step C. Thus, in some cases, additional processing does not further reduce the carbon concentration after performing the wet cleaning processes 95A-B.

The embodiments described herein may achieve advantages. By using a wet cleaning process including a heated mixture of sulfuric acid and hydrogen peroxide, a silicon oxycarbide material may be used as part of a FinFET device with less risk of damage to the silicon oxycarbide material. For example, a silicon oxycarbide material may be used for one, two, or more spacers formed on sidewalls of a dummy gate during processing. As silicon oxycarbide has a relatively low dielectric constant, the use of silicon oxycarbide within a FinFET device (e.g., as the material of spacers) can reduce parasitic capacitance of the FinFET device. For example, parasitic capacitance between a metal gate and source/drain contacts may be reduced. By reducing parasitic capacitance, the performance of the FinFET device can be improved, particularly at higher frequency operation. Additionally, the use of the wet cleaning process mixture as described herein can allow for silicon oxycarbide to be more reliably used in addition to multipatterning techniques. For example, multipatterning may be used to form devices with different epitaxial regions using the same epitaxial step by using selective masking and different etching processes for different devices. This can reduce overall processing steps, improve processing efficiency, and reduce manufacturing costs, while also providing the benefits of using silicon oxycarbide.

In an embodiment, a method includes forming a first fin and a second fin over a substrate, forming a first dummy gate structure over the first fin and a second dummy gate structure over the second fin, depositing a first layer of a silicon oxycarbide material on the first fin, on the second fin, on the first dummy gate structure, and on the second dummy gate structure, implanting impurities into the first fin and into the second fin through the first layer of the silicon oxycarbide material, after implanting impurities, depositing a second layer of the silicon oxycarbide material over the first layer of the silicon oxycarbide material, after depositing the second layer of the silicon oxycarbide material, performing a wet cleaning process on the first fin and the second fin, forming a first mask over the second fin and the second dummy gate structure, recessing the first fin adjacent the first dummy gate structure to form first recesses in the first fin, after recessing the first fin, performing the wet cleaning process on the first fin and the second fin, forming a second mask over the first fin and the first dummy gate structure, recessing the second fin adjacent the second dummy gate structure to form second recesses in the second fin, and performing an epitaxy process to simultaneously form first epitaxial source/drain regions in the first recesses and second epitaxial source/drain regions in the second recesses. In an embodiment, the method includes performing an anisotropic etching process on the first layer of the silicon oxycarbide material to form first spacers on the first dummy gate structure and on the second layer of the silicon oxycarbide material to form second spacers on the second dummy gate structure. In an embodiment, the first layer of the silicon oxycarbide material has a higher concentration of impurities than the second layer of the silicon oxycarbide material. In an embodiment, the wet cleaning process includes using a heated mixture of sulfuric acid and hydrogen peroxide. In an embodiment, the mixture of sulfuric acid and hydrogen peroxide is mixed at a molar ratio between 2:1 and 5:1. In an embodiment, the heated mixture is at a temperature between 80° C. and 180° C. In an embodiment, the method includes forming sidewall spacers over the second layer of silicon oxycarbide material, the sidewall spacers including a dielectric material that is different than the silicon oxycarbide material. In an embodiment, at least two first epitaxial source/drain regions are merged together. In an embodiment, the first recesses have a first depth and the second recesses have a second depth that is different from the first depth.

In an embodiment, a method includes patterning a substrate to form multiple first fins and multiple second fins, forming multiple first dummy gate structures on the multiple first fins, forming multiple second dummy gate structures on the multiple second fins, forming multiple first spacer structures on the multiple first dummy gate structures, forming multiple second spacer structures on the multiple second dummy gate structures, wherein the multiple first spacer structures and the multiple second spacer structures include a low-k dielectric material, forming first recesses in the multiple first fins, including performing a first wet descum process and performing a first anisotropic etching process to form first recesses in the multiple first fins, after forming the first recesses in the multiple first fins, forming second recesses in the multiple second fins, including performing a second wet descum process, and performing a second anisotropic etching process to form second recesses in the multiple second fins, and epitaxially growing first source/drain structures in the first recesses and second source/drain structures in the second recesses. In an embodiment, the first source/drain structure and the second source/drain structures are formed at the same time by the same epitaxial growth process. In an embodiment, the first anisotropic etching process is different than the second anisotropic etching process. In an embodiment, the low-k dielectric material is silicon oxycarbide. In an embodiment, forming the multiple first spacer structures includes depositing a first layer of the low-k dielectric material using a first deposition process, performing an implantation process on the first layer of the low-k dielectric material, and after performing the implantation process, depositing a second layer of the first low-k dielectric material using a second deposition process. In an embodiment, performing the first wet descum process includes heating a mixture of sulfuric acid and hydrogen peroxide to a temperature between 80° C. and 180° C. In an embodiment, the first source/drain structures have a larger volume than the second source/drain structures. In an embodiment, the first anisotropic etching process etches the multiple first spacer structures more than the second anisotropic etching process etches the multiple second spacer structures.

In an embodiment, a method includes forming a first fin extending from a substrate, forming a first gate stack over and along sidewalls of the first fin, forming a first spacer along a sidewall of the first gate stack, the first spacer including a first composition of silicon oxycarbide, forming a second spacer along a sidewall of the first spacer, the second spacer including a second composition of silicon oxycarbide, forming a third spacer along a sidewall of the second spacer, the third spacer including silicon nitride, and forming a first epitaxial source/drain region in the first fin and adjacent the third spacer. In an embodiment, the method includes forming a second fin extending from the substrate, forming a second gate stack over and along sidewalls of the second fin, forming a fourth spacer along a sidewall of the second gate stack, the fourth spacer including the first composition of silicon oxycarbide, forming a fifth spacer along a sidewall of the fourth spacer, the fifth spacer including the second composition of silicon oxycarbide, forming a sixth spacer along a sidewall of the fifth spacer, sixth third spacer including silicon nitride, and forming a second epitaxial source/drain region in the second fin and adjacent the sixth spacer, wherein the second epitaxial source/drain region has a different volume than the first epitaxial source/drain region. In an embodiment, the first fin includes silicon germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin over a substrate;
    forming a first dummy gate structure over the first fin and a second dummy gate structure over the second fin;
    depositing a first layer of a silicon oxycarbide material on the first fin, on the second fin, on the first dummy gate structure, and on the second dummy gate structure;
    implanting impurities into the first fin and into the second fin through the first layer of the silicon oxycarbide material;
    after implanting impurities, depositing a second layer of the silicon oxycarbide material over the first layer of the silicon oxycarbide material;
    after depositing the second layer of the silicon oxycarbide material, performing a first wet cleaning process on the first fin and the second fin;
    forming a first mask over the second fin and the second dummy gate structure;
    after performing the first wet cleaning process, recessing the first fin adjacent the first dummy gate structure to form first recesses in the first fin;
    after recessing the first fin, performing a second wet cleaning process on the first fin and the second fin;
    forming a second mask over the first fin and the first dummy gate structure;
    recessing the second fin adjacent the second dummy gate structure to form second recesses in the second fin; and
    performing an epitaxy process to simultaneously form first epitaxial source/drain regions in the first recesses and second epitaxial source/drain regions in the second recesses, wherein the first epitaxial source/drain regions form components of a first transistor, wherein the second epitaxial source/drain regions form components of a second transistor, the first epitaxial source/drain regions and the second epitaxial source/drain regions having a same conductivity type.

2. The method of claim 1, further comprising performing an anisotropic etching process on the first layer of the silicon oxycarbide material to form first spacers on the first dummy gate structure and on the second layer of the silicon oxycarbide material to form second spacers on the second dummy gate structure.

3. The method of claim 1, wherein the first layer of the silicon oxycarbide material has a higher concentration of impurities than the second layer of the silicon oxycarbide material.

4. The method of claim 1, wherein the first wet cleaning process and the second wet cleaning process comprise using a heated mixture of sulfuric acid and hydrogen peroxide.

5. The method of claim 4, wherein the mixture of sulfuric acid and hydrogen peroxide is mixed at a molar ratio between 2:1 and 5:1.

6. The method of claim 4, wherein the heated mixture is at a temperature between 80° C. and 180° C.

7. The method of claim 1, further comprising forming sidewall spacers over the second layer of silicon oxycarbide material, the sidewall spacers comprising a dielectric material that is different than the silicon oxycarbide material.

8. The method of claim 1, wherein at least two first epitaxial source/drain regions are merged together.

9. The method of claim 1, wherein the first recesses have a first depth and the second recesses have a second depth that is different from the first depth.

10. A method comprising:
    patterning a substrate to form a plurality of first fins and a plurality of second fins;
    forming a plurality of first dummy gate structures on the plurality of first fins;
    forming a plurality of second dummy gate structures on the plurality of second fins;

forming a plurality of first spacer structures on the plurality of first dummy gate structures;

forming a plurality of second spacer structures on the plurality of second dummy gate structures, wherein the plurality of first spacer structures and the plurality of second spacer structures comprise a low-k dielectric material;

forming first recesses in the plurality of first fins, comprising:

performing a first wet descum process; and after performing the first wet descum process, performing a first anisotropic etching process to form the first recesses in the plurality of first fins;

after forming the first recesses in the plurality of first fins, forming second recesses in the plurality of second fins, comprising:

performing a second wet descum process; and performing a second anisotropic etching process to form the second recesses in the plurality of second fins; and epitaxially growing first source/drain structures in the first recesses and second source/drain structures in the second recesses, wherein the first source/drain structures and the second source/drain structure have a same conductivity.

11. The method of claim 10, wherein the first source/drain structures and the second source/drain structures are formed at the same time by the same epitaxial growth process.

12. The method of claim 10, wherein the first anisotropic etching process is different than the second anisotropic etching process.

13. The method of claim 10, wherein the low-k dielectric material is silicon oxycarbide.

14. The method of claim 10, wherein forming the plurality of first spacer structures comprises:

depositing a first layer of the low-k dielectric material using a first deposition process;

performing an implantation process on the first layer of the low-k dielectric material; and after performing the implantation process, depositing a second layer of the low-k dielectric material using a second deposition process.

15. The method of claim 10, wherein performing the first wet descum process comprises heating a mixture of sulfuric acid and hydrogen peroxide to a temperature between 80° C. and 180° C.

16. The method of claim 10, wherein the first source/drain structures have a larger volume than the second source/drain structures.

17. The method of claim 10, wherein the first anisotropic etching process etches the plurality of first spacer structures more than the second anisotropic etching process etches the plurality of second spacer structures.

* * * * *